US011870280B2

(12) United States Patent
Merkl et al.

(10) Patent No.: US 11,870,280 B2
(45) Date of Patent: Jan. 9, 2024

(54) SYSTEMS AND METHODS FOR CONTROLLING SUPER CAPACITOR CHARGE VOLTAGE TO EXTEND SUPER CAPACITOR LIFE

(71) Applicant: Johnson Controls Technology Company, Auburn Hills, MI (US)

(72) Inventors: Christopher J. Merkl, Milwaukee, WI (US); George John Dietz, Delafield, WI (US); Gary A. Romanowich, Slinger, WI (US); Kevin Anthony Weiss, Gurnee, IL (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 119 days.

(21) Appl. No.: 16/574,806

(22) Filed: Sep. 18, 2019

(65) Prior Publication Data
US 2020/0091747 A1 Mar. 19, 2020

Related U.S. Application Data

(60) Provisional application No. 62/733,584, filed on Sep. 19, 2018.

(51) Int. Cl.
*H02J 7/00* (2006.01)
*G05B 19/042* (2006.01)
*G01R 31/64* (2020.01)
*H02J 7/34* (2006.01)
*G05B 15/02* (2006.01)

(52) U.S. Cl.
CPC ............... *H02J 7/00* (2013.01); *G01R 31/64* (2020.01); *G05B 19/0428* (2013.01); *G05B 15/02* (2013.01); *G05B 2219/25011* (2013.01); *H02J 7/345* (2013.01)

(58) Field of Classification Search
CPC ........................................................ H02J 7/00
USPC ........................................................ 320/167
See application file for complete search history.

(56) References Cited

U.S. PATENT DOCUMENTS

| 3,588,652 | A | 6/1971 | Lewis |
| 5,278,454 | A | 1/1994 | Strauss et al. |
| 5,422,808 | A | 6/1995 | Catanese et al. |
| 5,519,295 | A | 5/1996 | Jatnieks |
| 5,744,876 | A | 4/1998 | Fangio |

(Continued)

FOREIGN PATENT DOCUMENTS

| CN | 205781222 | 12/2016 |
| EP | 2 005 504 A1 | 12/2008 |

(Continued)

OTHER PUBLICATIONS

EP Search Report on EP Appl. Ser. No. 22154414.1 dated Jun. 13, 2022 (9 pages).

(Continued)

*Primary Examiner* — Yalkew Fantu
(74) *Attorney, Agent, or Firm* — Foley & Lardner LLP

(57) ABSTRACT

A method of determining a lifetime parameter of a capacitor in a failsafe device including measuring an amount of energy required to return the failsafe device to a failsafe position, measuring an effective capacitance of the capacitor, and comparing the amount of energy to the effective capacitance to determine the lifetime parameter of the capacitor.

20 Claims, 11 Drawing Sheets

(56) References Cited

U.S. PATENT DOCUMENTS

| | | | |
|---|---|---|---|
| 5,744,923 A | 4/1998 | Strauss et al. | |
| 6,100,655 A | 8/2000 | McIntosh | |
| 6,384,579 B2* | 5/2002 | Watanabe | H02M 3/33576 |
| | | | 320/166 |
| 7,023,163 B2* | 4/2006 | Charles | H02M 11/00 |
| | | | 318/563 |
| 7,671,569 B2* | 3/2010 | Kolb | H02J 7/0016 |
| | | | 320/166 |
| 8,138,706 B2 | 3/2012 | Ochsenbein et al. | |
| 8,242,624 B2* | 8/2012 | Brookfield | H02J 7/345 |
| | | | 307/9.1 |
| 9,024,591 B2 | 5/2015 | Narita | |
| 9,041,361 B2* | 5/2015 | Viancino | H03K 17/08126 |
| | | | 320/167 |
| 9,379,577 B2* | 6/2016 | Stupka | H02J 9/00 |
| 9,812,898 B2 | 11/2017 | Spivey et al. | |
| 10,133,251 B2 | 11/2018 | Furrer et al. | |
| 2013/0113441 A1* | 5/2013 | Narita | F16K 37/0083 |
| | | | 320/167 |
| 2014/0062200 A1 | 3/2014 | Stupka | |
| 2015/0226343 A1 | 8/2015 | Jenks | |
| 2015/0340882 A1* | 11/2015 | Göth | H02J 7/04 |
| | | | 320/167 |
| 2016/0061468 A1* | 3/2016 | Alexander | F24F 11/62 |
| | | | 700/276 |
| 2017/0293293 A1* | 10/2017 | Brownie | G05B 23/0275 |
| 2017/0295058 A1 | 10/2017 | Gottschalk et al. | |
| 2018/0067465 A1 | 3/2018 | Daraiseh et al. | |
| 2020/0091747 A1 | 3/2020 | Merkl et al. | |
| 2022/0155384 A1* | 5/2022 | Lovati | G01R 31/64 |

FOREIGN PATENT DOCUMENTS

| | | |
|---|---|---|
| KR | 549772 | 2/2006 |
| KR | 101259450 | 4/2013 |
| WO | WO-2018/011150 A1 | 1/2018 |

OTHER PUBLICATIONS

Liu et al., "Review on reliability of supercapacitors in energy storage applications," Applied Energy, Aug. 12, 2020, vol. 278, No. 115436 (13 pages).

Schachner et al., "Comparison of Energy Harvesting Concepts for Heating, Ventilation and Air Conditioning Systems," IECON 2018—44th Annual Conference of the IEEE Industrial Electronics Society, IEEE, Oct. 21, 2018 (pp. 6235-6240).

\* cited by examiner

SYSTEMS AND METHODS FOR CONTROLLING SUPER CAPACITOR CHARGE VOLTAGE TO EXTEND SUPER CAPACITOR LIFE

CROSS-REFERENCE TO RELATED PATENT APPLICATIONS

This application claims priority to provisional U.S. Patent Application No. 62/733,584, filed on Sep. 19, 2018, entitled: "Systems and Methods for Controlling Super Capacitor Charge Voltage to Extend Super Capacitor Life," the entire contents of which are incorporated by reference herein.

BACKGROUND

The present disclosure relates generally to the field of super capacitors, and more particularly to systems and methods for extending the life of super capacitors.

Unlike ordinary capacitors, super capacitors do not use the conventional solid dielectric, but rather, they use electrostatic double-layer capacitance and electrochemical pseudocapacitance, both of which contribute to the total capacitance of the capacitor. Specifically, electrostatic double-layer capacitors ("EDLC") use carbon electrodes or derivatives with much higher electrostatic double-layer capacitance than electrochemical pseudocapacitance. Separation of charge is achieved in EDLCs by using a Helmholtz double layer. The separation of charge is of the order of a few angstroms (0.3-0.8 nm), much smaller than in a conventional capacitor. By having a much smaller separation of charge, super capacitors are able to have a much greater capacitance than in conventional capacitors.

Super capacitors may be used throughout a building management system ("BMS"). A BMS is, in general, a system of devices configured to control, monitor, and manage equipment in or around a building or building area. A BMS may include a heating, ventilation, and air conditioning ("HVAC") system, a security system, a lighting system, a fire alerting system, another system that is capable of managing building functions or devices, or any combination thereof. BMS devices may be installed in any environment (e.g., an indoor area or an outdoor area) and the environment may include any number of buildings, spaces, zones, rooms, or areas. A BMS may include a variety of devices (e.g., HVAC devices, controllers, chillers, fans, sensors, etc.) configured to facilitate monitoring and controlling the building space. Super capacitors may be included in BMS devices.

Currently, many building management systems provide control of an entire facility, building, or other environment. For example, a building management system may be configured to monitor multiple buildings, each having HVAC systems, water system, lights, air quality, security, and/or any other aspect of the facility within the purview of the building management system.

Super capacitors may experience aging during use. Aging may result in decreased capacitance and increased internal resistance. Aging may be accelerated with exposure to high temperatures and high operating voltages. As a result, the super capacitor may still be operable, but the capabilities may be significantly reduced (e.g., as a super capacitor ages, the amount of energy it may store will decrease). Some systems operate super capacitors at their rated voltage, which increases the energy stored, but may shorten the operating life of the super capacitor. Other systems operate super capacitors at a voltage lower than the rated voltage, which may prolong the life of the super capacitor, but results in decreased energy storage. Accordingly, there exists a tradeoff between energy storage and super capacitor life.

SUMMARY

One implementation of the present disclosure is a method of determining a lifetime for a capacitor in a failsafe device. The method including measuring an amount of energy required to return the failsafe device to a failsafe position, measuring an effective capacitance of the capacitor, comparing the amount of energy to the effective capacitance, and sending, based on the comparison, an indication of the lifetime of the capacitor.

In some embodiments, the method further includes determining, based on the effective capacitance, a charge voltage for the capacitor, and charging the capacitor using the charge voltage. In some embodiments, measuring the effective capacitance includes charging the capacitor to full charge, measuring a first voltage of the capacitor, discharging the capacitor through a known load, measuring the current associated with the discharging, and measuring a second voltage of the capacitor. In some embodiments, the failsafe device is an actuator. In some embodiments, measuring the amount of energy required to return the failsafe device to the failsafe position includes driving the actuator from a first position to a second position, and measuring an amount of energy associated with driving the actuator from the first position to the second position. In some embodiments, a range of movement of the actuator is greater than a range of movement between the first position and the second position. In some embodiments, the indication signals that the capacitor should be replaced.

Another implementation of the present disclosure is a method of charging a capacitor in a failsafe device. The method including measuring an amount of energy required to return the failsafe device to a failsafe position, measuring an effective capacitance of the capacitor, determining, based on the effective capacitance and the amount of energy, a charge voltage for the capacitor, and charging the capacitor using the charge voltage.

In some embodiments, measuring the effective capacitance includes charging the capacitor to full charge, measuring a first voltage of the capacitor, discharging the capacitor through a known load, measuring the current associated with the discharging, and measuring a second voltage of the capacitor. In some embodiments, the failsafe device is an actuator. In some embodiments, measuring the amount of energy required to return the failsafe device to the failsafe position includes driving the actuator from a first position to a second position, and measuring an amount of energy associated with driving the actuator from the first position to the second position. In some embodiments, a range of movement of the actuator is greater than a range of movement between the first position and the second position. In some embodiments, the method further includes comparing the amount of energy to the effective capacitance, and sending, based on the comparison, an indication of the lifetime of the capacitor. In some embodiments, the indication signals that the capacitor should be replaced.

Another implementation of the present disclosure is a failsafe device assembly including an actuator, a capacitor, and a processing circuit including a processor and memory. The memory having instructions stored thereon that, when executed by the processor, cause the processing circuit to measure an amount of energy required to return the actuator to a failsafe position, measure an effective capacitance of the capacitor, compare the amount of energy to the effective capacitance, and send, based on the comparison, an indication of the lifetime of the capacitor.

In some embodiments, the memory has further instructions stored thereon that, when executed by the processor, cause the processing circuit to determine, based on the effective capacitance, a charge voltage for the capacitor, and charge the capacitor using the charge voltage. In some embodiments, measuring the effective capacitance includes charging the capacitor to full charge, measuring a first voltage of the capacitor, discharging the capacitor through a known load, measuring the current associated with the discharging, and measuring a second voltage of the capacitor. In some embodiments, measuring the amount of energy required to return the actuator to the failsafe position includes driving the actuator from a first position to a second position, and measuring an amount of energy associated with driving the actuator from the first position to the second position. In some embodiments, a range of movement of the actuator is greater than a range of movement between the first position and the second position. In some embodiments, the indication signals that the capacitor should be replaced.

Another implementation of the present disclosure is a method of determining a lifetime parameter of a capacitor in a failsafe device including measuring an amount of energy required to return the failsafe device to a failsafe position, measuring an effective capacitance of the capacitor, comparing the amount of energy to the effective capacitance to determine the lifetime parameter of the capacitor, and sending the lifetime parameter of the capacitor.

In some embodiments, the method further includes determining, based on the effective capacitance, a charge voltage for the capacitor, and charging the capacitor using the charge voltage. In some embodiments, the lifetime parameter is a length of time associated with a remaining operational period of the capacitor. In some embodiments, the failsafe device is an actuator. In some embodiments, the lifetime parameter is an amount of time required to charge the capacitor to a level associated with the amount of energy required to return the failsafe device to the failsafe position. In some embodiments, the lifetime parameter is diagnostic information associated with physically testing an ability of the capacitor to return the failsafe device to the failsafe position. In some embodiments, the indication signals that the capacitor should be replaced.

Another implementation of the present disclosure is a method of charging a capacitor in a failsafe device including measuring an amount of energy required to return the failsafe device to a failsafe position, measuring an effective capacitance of the capacitor, determining, based on the effective capacitance and the amount of energy, a charge voltage for the capacitor, and charging the capacitor using the charge voltage.

In some embodiments, the failsafe device is an actuator. In some embodiments, the method further includes comparing the amount of energy to the effective capacitance to determine a lifetime parameter of the capacitor, and sending an indication of the lifetime parameter. In some embodiments, the indication signals that the capacitor should be replaced. In some embodiments, the indication is a length of time associated with a remaining operational period of the capacitor. In some embodiments, the indication is an amount of time required to charge the capacitor to a level associated with the amount of energy required to return the failsafe device to the failsafe position. In some embodiments, the indication is diagnostic information associated with physically testing an ability of the capacitor to return the failsafe device to the failsafe position.

Another implementation of the present disclosure is a failsafe device assembly including an actuator, a capacitor, and a processing circuit including a processor and memory, the memory having instructions stored thereon that, when executed by the processor, cause the processing circuit to measure an amount of energy required to return the actuator to a failsafe position, measure an effective capacitance of the capacitor, compare the amount of energy to the effective capacitance to determine an operational parameter of the actuator, and operate the actuator according to the operational parameter.

In some embodiments, the memory having further instructions stored thereon that, when executed by the processor, cause the processing circuit to determine, based on the effective capacitance, a charge voltage for the capacitor, and charge the capacitor using the charge voltage. In some embodiments, the operational parameter describes a speed with which the actuator returns to the failsafe position. In some embodiments, determining the operational parameter of the actuator further includes receiving a selection of the speed from a user. In some embodiments, the memory having further instructions stored thereon that, when executed by the processor, cause the processing circuit to compare the amount of energy to the effective capacitance to determine a lifetime parameter of the capacitor, and send an indication of the lifetime parameter. In some embodiments, the indication signals that the capacitor should be replaced.

DETAILED DESCRIPTION

Overview

Figure 1:
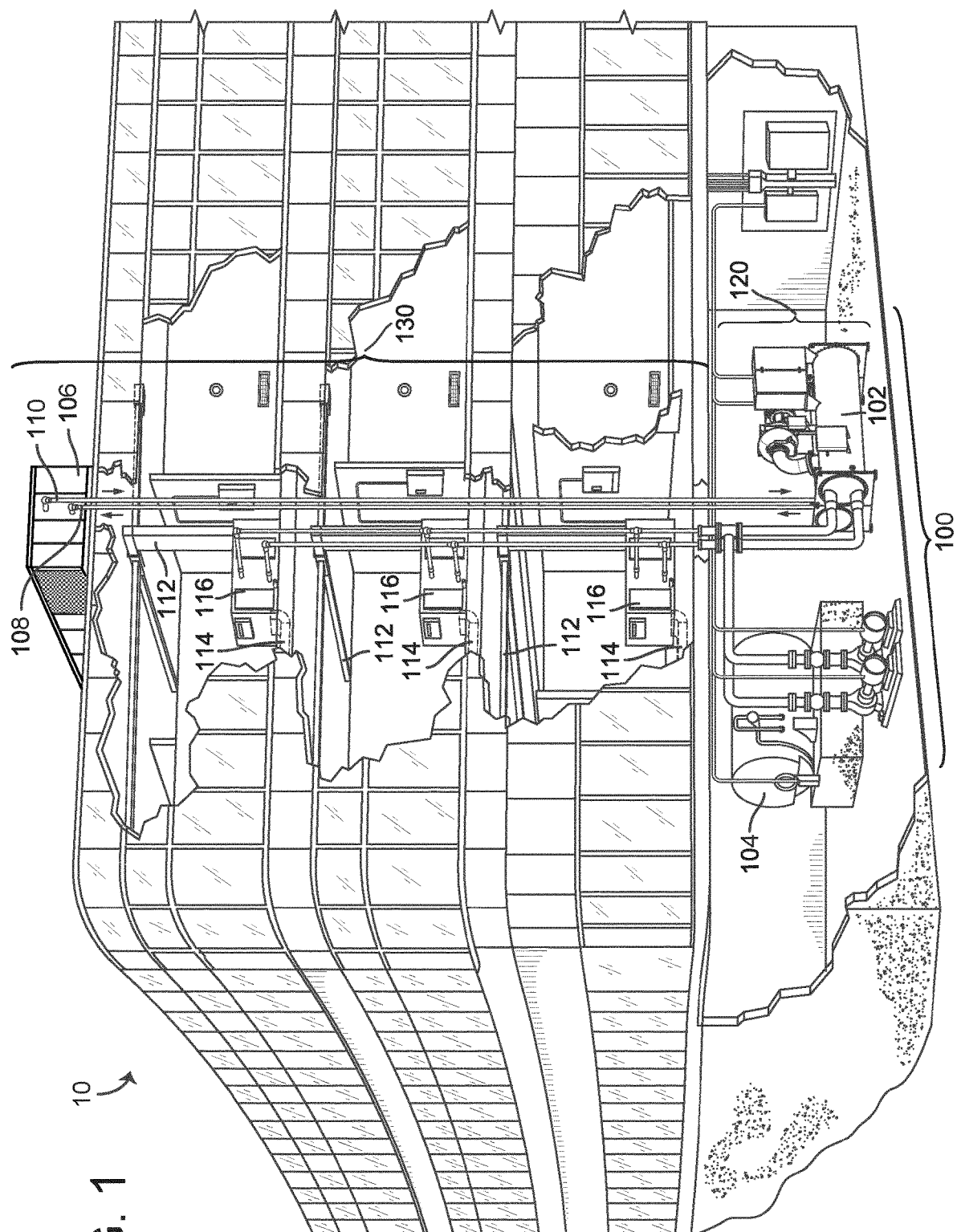
FIG. 1 is a drawing of a building equipped with a HVAC system, according to some embodiments.

Super capacitors are generally used in applications requiring many rapid charge/discharge cycles rather than long term compact energy storage. For example, super capacitors may be used within cars, buses, trains, cranes and elevators, where they are used for regenerative braking, short-term energy storage, or burst-mode power delivery.

As indicated above, super capacitors generally have a "rated voltage." The rated voltage corresponds to a maximum voltage level that should be used to charge the super capacitor. Typically, the rated voltage may include a safety margin to prevent accidental decomposition of the electrolyte.

As described above, some systems operate super capacitors at their rated voltage, which increases the energy stored, but may shorten the operating life of the super capacitor. Other systems operate super capacitors at a voltage lower than the rated voltage, which may prolong the life of the super capacitor, but results in decreased energy storage. Accordingly, there exists a tradeoff between energy storage and the life of the super capacitor.

The present disclosure is directed towards measuring and extending the life of a capacitor and controlling operation of a failsafe device based on the measured lifetime of the capacitor. In some embodiments, the present disclosure includes systems and methods for determining and implementing a minimum required operating voltage (e.g., the voltage needed to produce a predetermined output in a device).

As one example, a minimum required operating voltage that corresponds to proper operating of a fail safe return (i.e., an actuator returns to a default position when power is removed) may be determined and implemented. In some embodiments, the capacitance of the super capacitor may be measured by a controller at an initial charging state, after the device (e.g., actuator) is powered. Based on the capacitance measurement, the appropriate operating voltage (i.e., charge voltage) may be configured by the controller. Accordingly, the super capacitor may be configured to be charged to lower voltages at the start of its life cycle (which may reduce aging), and charged to higher voltages later in the life cycle (which may offset capacitance reduction).

In some embodiments, the present disclosure includes systems and methods for controlling operation of a failsafe device based on measured characteristics of the capacitor. As one example, a controller may determine the energy required to operate a failsafe device (e.g., return the failsafe device to a failsafe position). Based on the energy determination, a lifetime of an associated capacitor (e.g., a failsafe capacitor) may be determined by the controller. Accordingly, the failsafe device (e.g., an actuator, etc.) may be configured to operate at slower speeds (which may offset capacitance reduction). Additionally or alternatively, the controller may collect diagnostics associated with the failsafe device to determine when the device (or components thereof) need to be replaced and/or to send an indication of the lifetime of the device.

Building HVAC Systems and Building Management Systems

Figure 2:
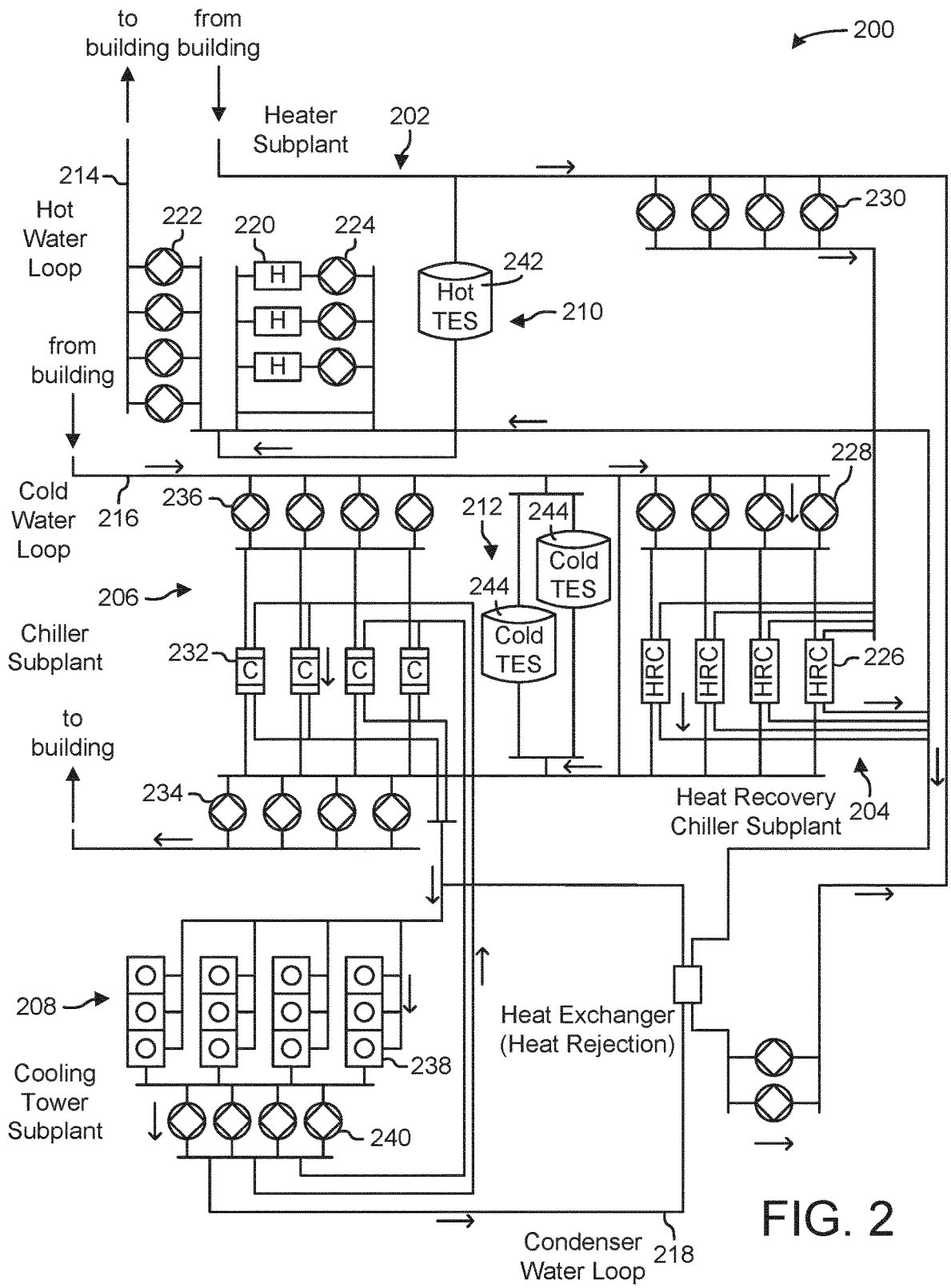
FIG. 2 is a block diagram of a waterside system which may be used to serve the building of FIG. 1, according to some embodiments.
Figure 3:
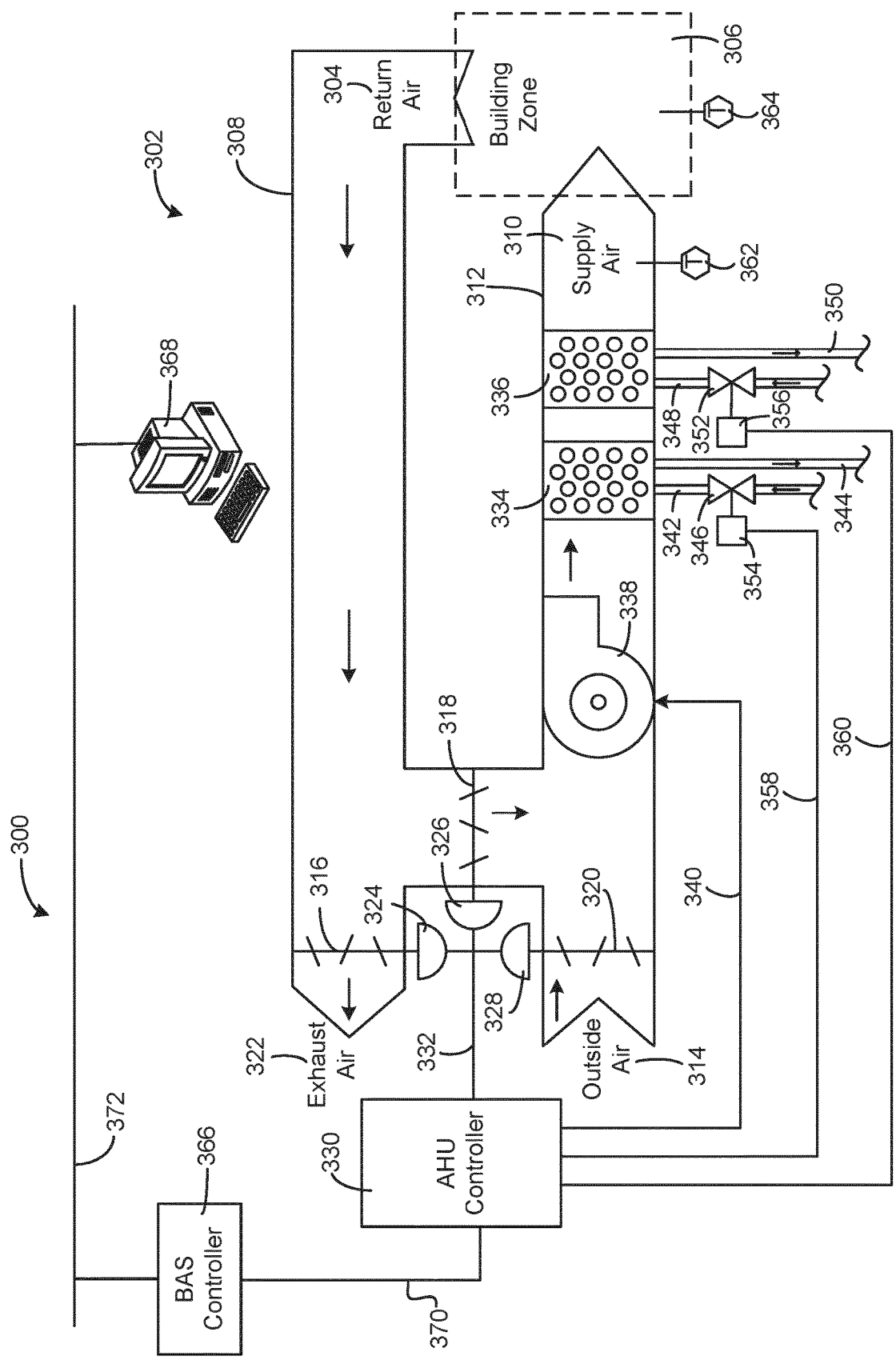
FIG. 3 is a block diagram of an airside system which may be used to serve the building of FIG. 1, according to some embodiments.
Figure 4:
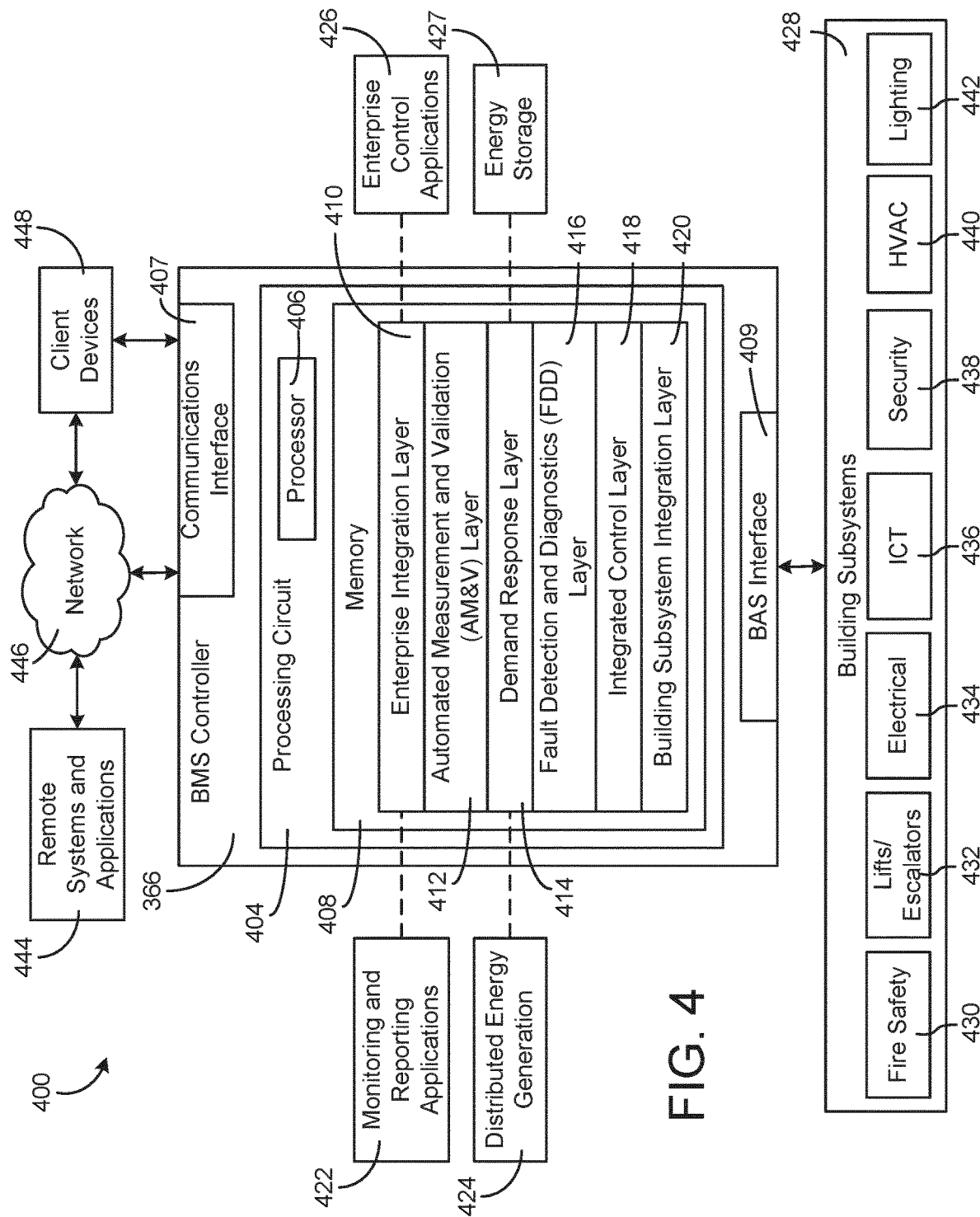
FIG. 4 is a block diagram of a building management system (BMS) which may be used to monitor and control the building of FIG. 1, according to some embodiments.

Referring now to FIGS. 1-4, several building management systems (BMS) and HVAC systems in which the systems and methods of the present disclosure may be implemented are shown, according to some embodiments. In brief overview, FIG. 1 shows a building 10 equipped with a HVAC system 100. FIG. 2 is a block diagram of a waterside system 200 which may be used to serve building 10. FIG. 3 is a block diagram of an airside system 300 which may be used to serve building 10. FIG. 4 is a block diagram of a BMS which may be used to monitor and control building 10.

Building and HVAC System

Referring particularly to FIG. 1, a perspective view of a building 10 is shown. Building 10 is served by a BMS. A BMS is, in general, a system of devices configured to control, monitor, and manage equipment in or around a building or building area. A BMS may include, for example, a HVAC system, a security system, a lighting system, a fire alerting system, any other system that is capable of managing building functions or devices, or any combination thereof.

The BMS that serves building 10 includes a HVAC system 100. HVAC system 100 may include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. An exemplary waterside system and airside system which may be used in HVAC system 100 are described in greater detail with reference to FIGS. 2-3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 may be located in or around building 10 (as shown in FIG. 1) or at an offsite location such as a central plant (e.g., a chiller plant, a steam plant, a heat plant, etc.). The working fluid may be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 may be transported to AHU 106 via piping 108.

AHU 106 may place the working fluid in a heat exchange relationship with an airflow passing through AHU 106 (e.g., via one or more stages of cooling coils and/or heating coils). The airflow may be, for example, outside air, return air from within building 10, or a combination of both. AHU 106 may transfer heat between the airflow and the working fluid to provide heating or cooling for the airflow. For example, AHU 106 may include one or more fans or blowers configured to pass the airflow over or through a heat exchanger including the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 may include dampers or other flow control elements that may be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 may include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve set point conditions for the building zone.

Waterside System

Referring now to FIG. 2, a block diagram of a waterside system 200 is shown, according to some embodiments. In various embodiments, waterside system 200 may supplement or replace waterside system 120 in HVAC system 100 or may be implemented separate from HVAC system 100. When implemented in HVAC system 100, waterside system 200 may include a subset of the HVAC devices in HVAC system 100 (e.g., boiler 104, chiller 102, pumps, valves, etc.) and may operate to supply a heated or chilled fluid to AHU 106. The HVAC devices of waterside system 200 may be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve thermal energy loads (e.g., hot water, cold water, heating, cooling, etc.) of a building or campus. For example, heater subplant 202 may be configured to heat water in a hot water loop 214 that circulates the hot water between heater subplant 202 and building 10. Chiller subplant 206 may be configured to chill water in a cold water loop 216 that circulates the cold water between chiller subplant 206 building 10. Heat recovery chiller subplant 204 may be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air may be delivered to individual zones of building 10 to serve thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) may be used in place of or in addition to water to serve thermal energy loads. In other embodiments, subplants 202-212 may provide heating and/or cooling directly to the building or campus without requiring an intermediate heat transfer fluid. These and other variations to waterside system 200 are within the teachings of the present disclosure.

Each of subplants 202-212 may include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves may be integrated with the pumps or positioned upstream or downstream of the pumps to control the fluid flows in waterside system 200. In various embodiments, waterside system 200 may include more, fewer, or different types of devices and/or subplants based on the particular configuration of waterside system 200 and the types of loads served by waterside system 200.

Airside System

Referring now to FIG. 3, a block diagram of an airside system 300 is shown, according to some embodiments. In various embodiments, airside system 300 may supplement or replace airside system 130 in HVAC system 100 or may be implemented separate from HVAC system 100. When implemented in HVAC system 100, airside system 300 may include a subset of the HVAC devices in HVAC system 100 (e.g., AHU 106, VAV units 116, ducts 112-114, fans, dampers, etc.) and may be located in or around building 10. Airside system 300 may operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 may be configured to operate exhaust air damper 316, mixing damper 318, and outside air damper 320 to control an amount of outside air 314 and return air 304 that combine to form supply air 310. Any return air 304 that does not pass through mixing damper 318 may be exhausted from AHU 302 through exhaust damper 316 as exhaust air 322.

Each of dampers 316-320 may be operated by an actuator. For example, exhaust air damper 316 may be operated by actuator 324, mixing damper 318 may be operated by actuator 326, and outside air damper 320 may be operated by actuator 328. Actuators 324-328 may communicate with an AHU controller 330 via a communications link 332. Actuators 324-328 may receive control signals from AHU controller 330 and may provide feedback signals to AHU controller 330. Feedback signals may include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that may be collected, stored, or used by actuators 324-328. AHU controller 330 may be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 may be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from waterside system 200 (e.g., from cold water loop 216) via piping 342 and may return the chilled fluid to waterside system 200 via piping 344. Valve 346 may be positioned along piping 342 or piping 344 to control a flow rate of the chilled fluid through cooling coil 334. In some embodiments, cooling coil 334 includes multiple stages of cooling coils that may be independently activated and deactivated (e.g., by AHU controller 330, by BMS controller 366, etc.) to modulate an amount of cooling applied to supply air 310.

Heating coil 336 may receive a heated fluid from waterside system 200 (e.g., from hot water loop 214) via piping 348 and may return the heated fluid to waterside system 200 via piping 350. Valve 352 may be positioned along piping 348 or piping 350 to control a flow rate of the heated fluid through heating coil 336. In some embodiments, heating coil 336 includes multiple stages of heating coils that may be independently activated and deactivated (e.g., by AHU controller 330, by BMS controller 366, etc.) to modulate an amount of heating applied to supply air 310.

Each of valves 346 and 352 may be controlled by an actuator. For example, valve 346 may be controlled by actuator 354 and valve 352 may be controlled by actuator 356. Actuators 354-356 may communicate with AHU controller 330 via communications links 358-360. Actuators 354-356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 may include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 may communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 may be separate (as shown in FIG. 3) or integrated. In an integrated implementation, AHU controller 330 may be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362-364, equipment on/off states, equipment operating capacities, and/or any other information that may be used by BMS controller 366 to monitor or control a variable state or condition within building zone 306.

Client device 368 may include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 may be a computer workstation, a client terminal, a remote or local interface, or any other type of user interface device. Client device 368 may be a stationary terminal or a mobile device. For example, client device 368 may be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Building Management Systems

Referring now to FIG. 4, a block diagram of a building management system (BMS) 400 is shown, according to some embodiments. BMS 400 may be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 may include fewer, additional, or alternative subsystems. For example, building subsystems 428 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 may include any number of devices, controllers, and connections for completing its individual functions and control activities. HVAC subsystem 440 may include many of the same components as HVAC system 100, as described with reference to FIGS. 1-3. For example, HVAC subsystem 440 may include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 may include any number of light fixtures, ballasts, lighting sensors, dimmers, or other devices configured to controllably adjust the amount of light provided to a building space. Security subsystem 438 may include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Interface 407 may facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 may also facilitate communications between BMS controller 366 and client devices 448. BMS interface 409 may facilitate communications between BMS controller 366 and building subsystems 428 (e.g., HVAC, lighting security, lifts, power distribution, business, etc.).

Interfaces 407, 409 may be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 may be direct (e.g., local wired or wireless communications) or via a communications network 446 (e.g., a WAN, the Internet, a cellular network, etc.). For example, interfaces 407, 409 may include an Ethernet card and port for sending and receiving data via an Ethernet-based communications link or network. In another example, interfaces 407, 409 may include a Wi-Fi transceiver for communicating via a wireless communications network. In another example, one or both of interfaces 407, 409 may include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 may be communicably connected to BMS interface 409 and/or communications interface 407 such that processing circuit 404 and the various components thereof may send and receive data via interfaces 407, 409. Processor 406 may be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present application. Memory 408 may be or include volatile memory or non-volatile memory. Memory 408 may include database components, object code components, script components, or any other type of information structure for supporting the various activities and information structures described in the present application. According to some embodiments, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 may be distributed across multiple servers or computers (e.g., that may exist in distributed locations). Further, while FIG. 4 shows applications 422 and 426 as existing outside of BMS controller 366, in some embodiments, applications 422 and 426 may be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration layer 420. Layers 410-420 may be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 may be configured to serve clients or local applications with information and services to support a variety of enterprise-level applications. For example, enterprise control applications 426 may be configured to provide subsystem-spanning control to a graphical user interface (GUI) or to any number of enterprise-level business applications (e.g., accounting systems, user identification systems, etc.). Enterprise control applications 426 may also or alternatively be configured to provide configuration GUIs for configuring BMS controller 366. In yet other embodiments, enterprise control applications 426 may work with layers 410-420 to optimize building performance (e.g., efficiency, energy use, comfort, or safety) based on inputs received at interface 407 and/or BMS interface 409.

Building subsystem integration layer 420 may be configured to manage communications between BMS controller 366 and building subsystems 428. For example, building subsystem integration layer 420 may receive sensor data and input signals from building subsystems 428 and provide output data and control signals to building subsystems 428. Building subsystem integration layer 420 may also be configured to manage communications between building subsystems 428. Building subsystem integration layer 420 translate communications (e.g., sensor data, input signals, output signals, etc.) across a plurality of multi-vendor/multi-protocol systems.

Demand response layer 414 may be configured to optimize resource usage (e.g., electricity use, natural gas use, water use, etc.) and/or the monetary cost of such resource usage in response to satisfy the demand of building 10. The optimization may be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 may receive inputs from other layers of BMS controller 366 (e.g., building subsystem integration layer 420, integrated control layer 418, etc.). The inputs received from other layers may include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to some embodiments, demand response layer 414 includes control logic for responding to the data and signals it receives. These responses may include communicating with the control algorithms in integrated control layer 418, changing control strategies, changing setpoints, or activating/deactivating building equipment or subsystems in a controlled manner. Demand response layer 414 may also include control logic configured to determine when to utilize stored energy. For example, demand response layer 414 may determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models may include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 414 may further include or draw upon one or more demand response policy definitions (e.g., databases, XML files, etc.). The policy definitions may be edited or adjusted by a user (e.g., via a graphical user interface) so that the control actions initiated in response to demand inputs may be tailored for the user's application, desired comfort level, particular building equipment, or based on other concerns. For example, the demand response policy definitions may specify which equipment may be turned on or off in response to particular demand inputs, how long a system or piece of equipment should be turned off, what setpoints may be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 may be configured to use the data input or output of building subsystem integration layer 420 and/or demand response layer 414 to make control decisions. Due to the subsystem integration provided by building subsystem integration layer 420, integrated control layer 418 may integrate control activities of the subsystems 428 such that the subsystems 428 behave as a single integrated supersystem. In some embodiments, integrated control layer 418 includes control logic that uses inputs and outputs from a plurality of building subsystems to provide greater comfort and energy savings relative to the comfort and energy savings that separate subsystems could provide alone. For example, integrated control layer 418 may be configured to use an input from a first subsystem to make an energy-saving control decision for a second subsystem. Results of these decisions may be communicated back to building subsystem integration layer 420.

Integrated control layer 418 is shown to be logically below demand response layer 414. Integrated control layer 418 may be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 may be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 may be configured to provide feedback to demand response layer 414 so that demand response layer 414 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 may be configured to provide calculated inputs (e.g., aggregations) to these higher levels based on outputs from more than one building subsystem.

Automated measurement and validation (AM&V) layer 412 may be configured to verify whether control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 may be based on building system energy models and/or equipment models for individual BMS devices or subsystems. For example, AM&V layer 412 may compare a model-predicted output with an actual output from building subsystems 428 to determine an accuracy of the model.

Fault detection and diagnostics (FDD) layer 416 may be configured to provide on-going fault detection for building subsystems 428, building subsystem devices (i.e., building equipment), and control algorithms used by demand response layer 414 and integrated control layer 418. FDD layer 416 may receive data inputs from integrated control layer 418, directly from one or more building subsystems or devices, or from another data source. FDD layer 416 may automatically diagnose and respond to detected faults. The responses to detected or diagnosed faults may include providing an alert message to a user, a maintenance scheduling system, or a control algorithm configured to attempt to repair the fault or to work-around the fault.

FDD layer 416 may be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to some embodiments, FDD layer 416 (or a policy executed by an integrated control engine or business rules engine) may shut-down systems or direct control activities around faulty devices or systems to reduce energy waste, extend equipment life, or assure proper control response.

FDD layer 416 may be configured to store or access a variety of different system data stores (or data points for live data). FDD layer 416 may use some content of the data stores to identify faults at the equipment level (e.g., specific chiller, specific AHU, specific terminal unit, etc.) and other content to identify faults at component or subsystem levels. For example, building subsystems 428 may generate temporal (i.e., time-series) data indicating the performance of BMS 400 and the various components thereof. The data generated by building subsystems 428 may include measured or calculated values that exhibit statistical characteristics and provide information about how the corresponding system or process (e.g., a temperature control process, a flow control process, etc.) is performing in terms of error from its set point. These processes may be examined by FDD layer 416 to expose when the system begins to degrade in performance and alert a user to repair the fault before it becomes more severe.

Measuring Capacitor Lifetime/Adjusting Super Capacitor Charge Voltage

Figure 5:
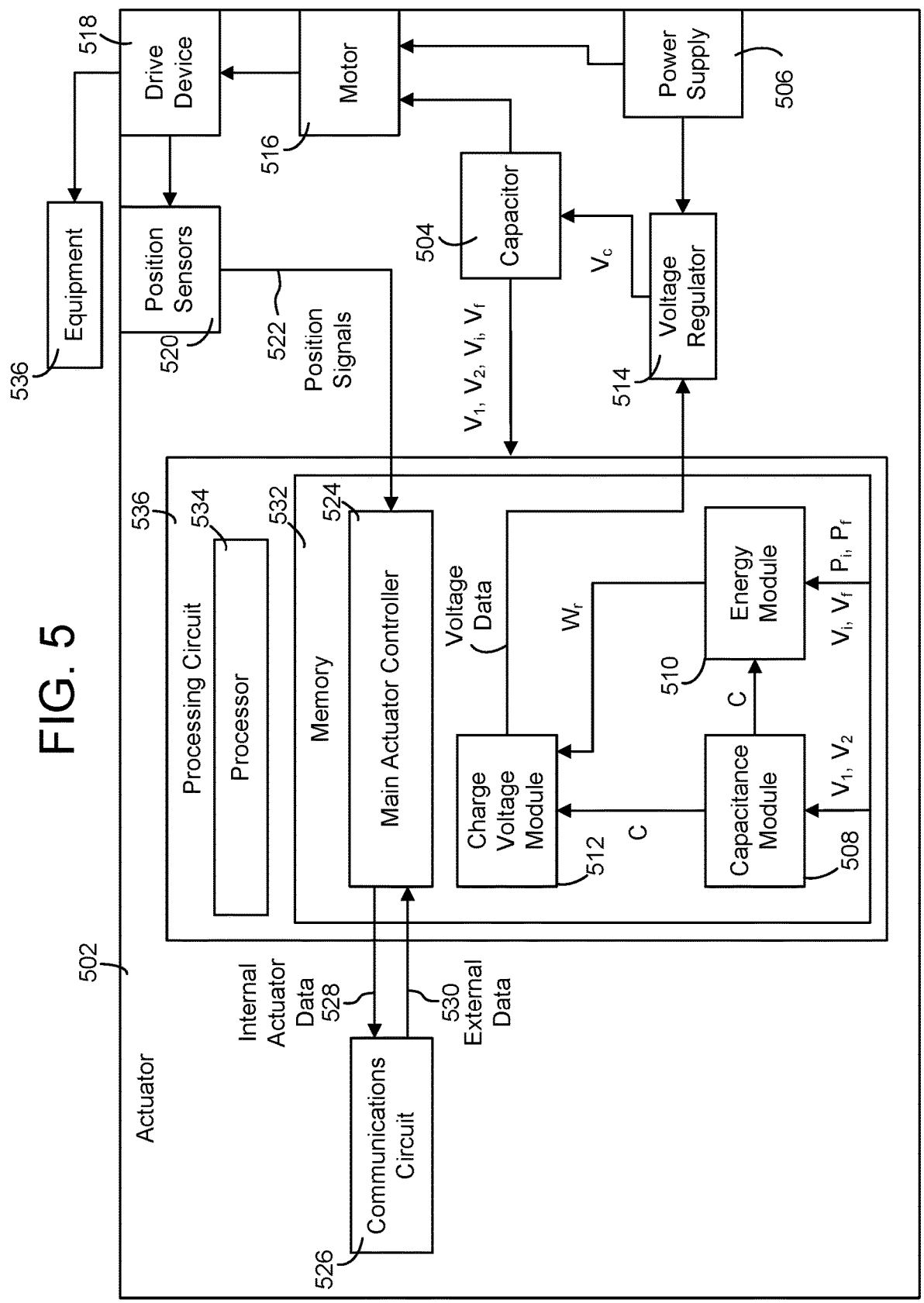
FIG. 5 is a block diagram of an actuator that includes a super capacitor with adjustable charge voltage, according to some embodiments.
Figure 6:
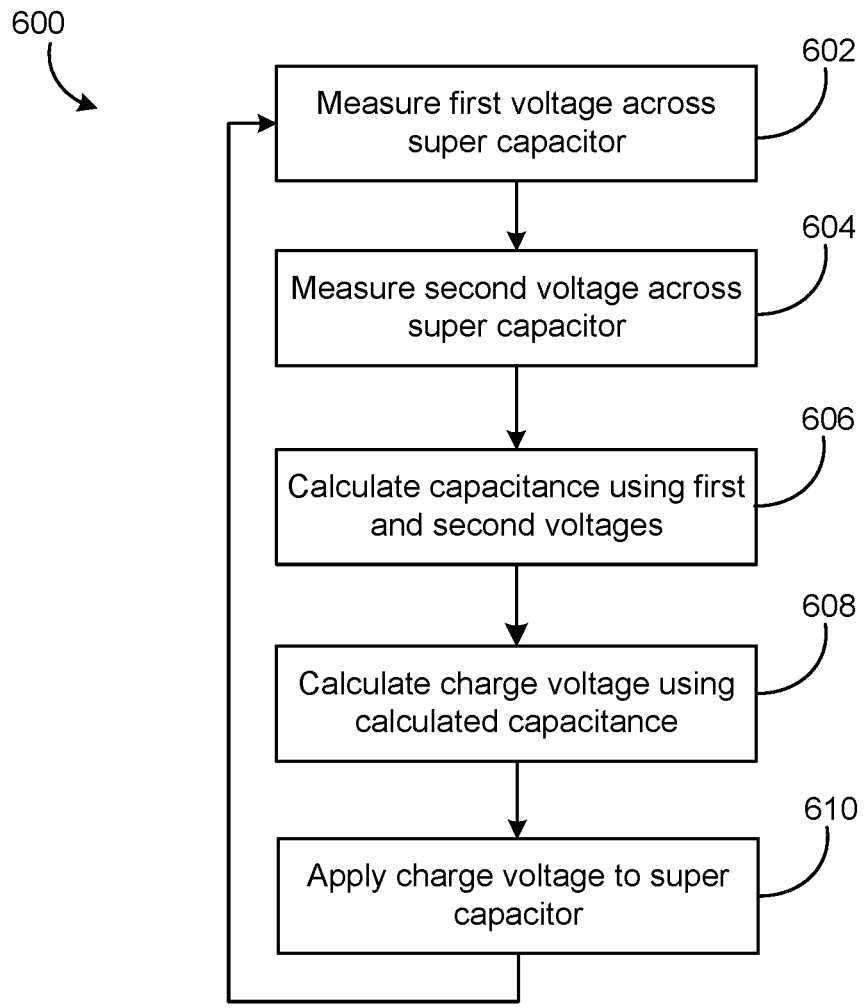
FIG. 6 is a flowchart of a process for controlling charge voltage of a super capacitor, according to some embodiments.
Figure 7:
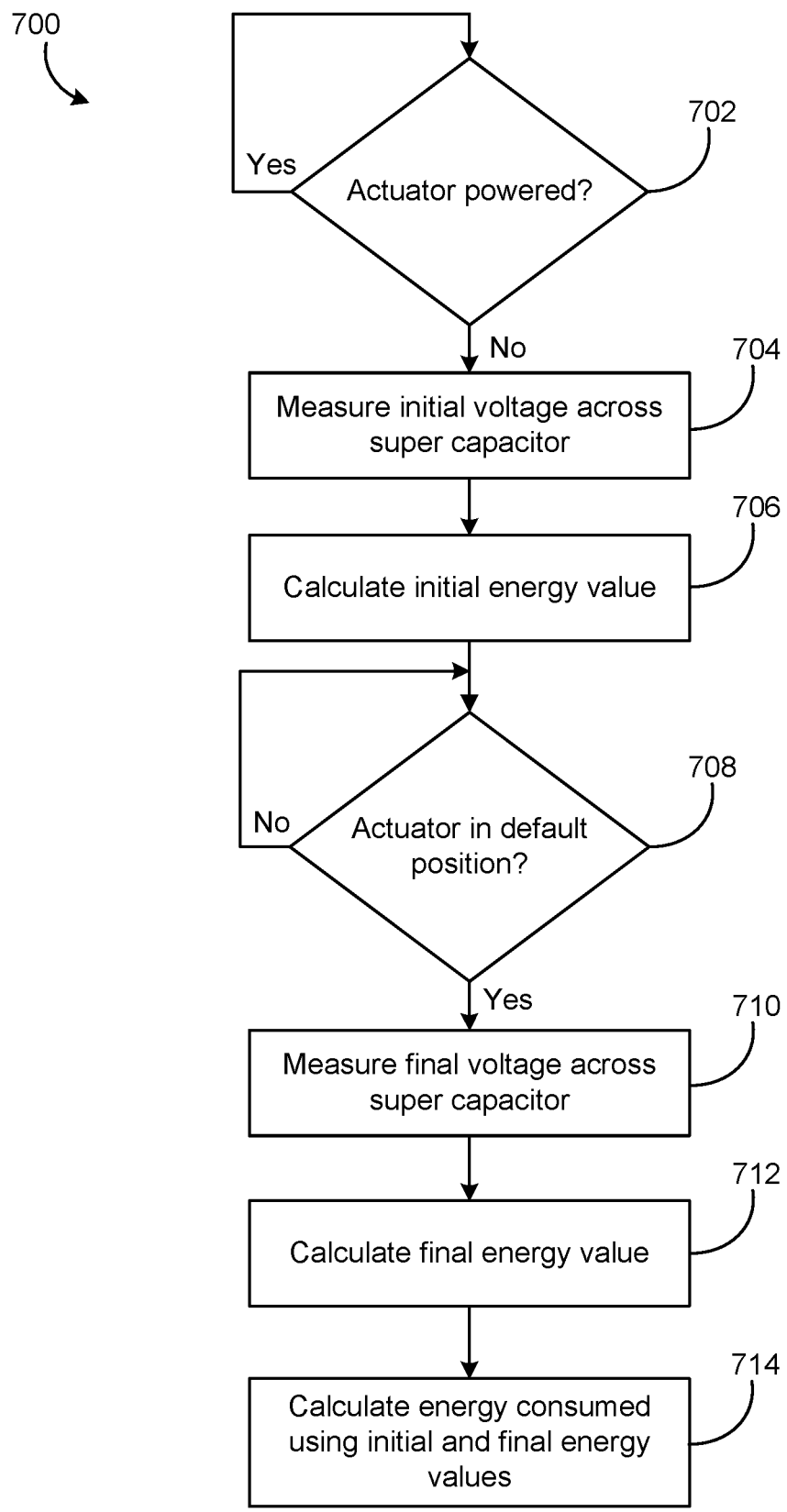
FIG. 7 is a flowchart of a process for determining an energy value corresponding to an actuator operation, according to some embodiments.
Figure 8:
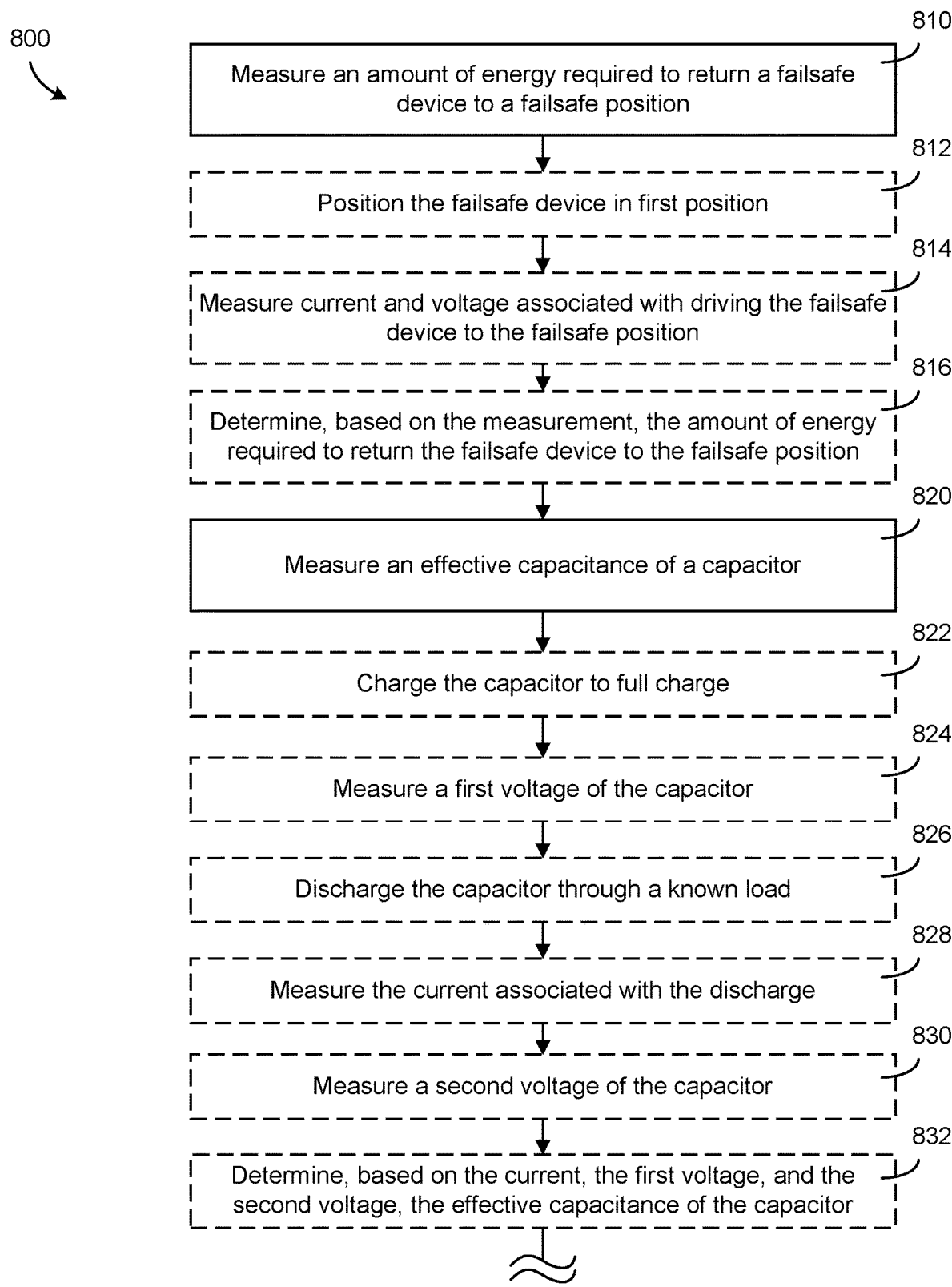
FIG. 8 is a flowchart of a process for determining parameters associated with a failsafe device, according to some embodiments.

Referring now to FIGS. 5-8, various systems and processes for determining an ideal charge voltage and adjusting a charge voltage of a super capacitor are shown, according to some embodiments. In brief overview, FIG. 5 shows a block diagram of an actuator that includes a super capacitor with adjustable charge voltage. FIG. 6 is a flowchart of a process for controlling charge voltage of a super capacitor. FIG. 7 is a flowchart of a process for determining an energy value corresponding to an actuator operation. FIG. 8 is a flowchart of a process for measuring parameters associated with a failsafe device.

Referring particularly to FIG. 5, a block diagram of an actuator that includes a super capacitor with adjustable charge voltage is shown, according to some embodiments. Actuator 502 may be used to service a building (e.g., building 10). For example, actuator 502 may be part of waterside system 200. Actuator 502 may be or may be part of a failsafe device (e.g., a device configured to fail in a specific position when power is removed). In some embodiments, actuator 502 is integrated within a building management system (e.g., BMS 400). For example, actuator 502 may send service request indications to BMS 400. Actuator 502 may facilitate the reduction of aging effects in super capacitors. By reducing the effects of aging for capacitors, actuator 502 may increase nominal capacity and reduce the equivalent series resistance ("ESR") of super capacitors. Therefore, the super capacitors may have an extended life cycle and charge to higher voltages later in their life cycle.

Actuator 502 offers a number of benefits over existing actuators. Actuator 502 may be a failsafe device that includes a capacitor to facilitate driving actuator 502 to a failsafe position in the event of a failure event (e.g., loss of power, etc.). Traditional failsafe devices typically include a spring to facilitate return to a failsafe position. A spring limits the failsafe position to an extreme (e.g., actuator fully extended, actuator fully retracted). Furthermore, a failsafe device including a spring to facilitate return to a failsafe position requires the failsafe device to continuously fight against the action of the spring. For example, the failsafe device must continuously overcome the action of the spring during normal operation, thereby requiring extra energy to power the failsafe device and making the failsafe device inefficient. Actuator 502 may facilitate return to a failsafe position that is not an extreme (e.g., in-between fully extended and fully retracted). For example, in a three-valve scenario actuator 502 may return to a failsafe position that is in the middle of the three-valve. In various embodiments, actuator 502 does not include a spring to facilitate return to a failsafe position and therefore does not have to fight against the action of the spring, thereby increasing an efficiency of actuator 502 over traditional failsafe devices.

Actuator 502 offers a number of benefits over existing capacitive return actuators. Traditional capacitive return failsafe devices include a capacitor to facilitate return to a failsafe position. The performance (e.g., capacitance, charge time, maximum voltage rating, etc.) of a capacitor may degrade over time, thereby limiting the capacitors ability to provide energy to drive a failsafe device to a failsafe position. Traditional capacitive return failsafe devices include an oversized capacitor (e.g., a super capacitor, etc.) to account for capacitor performances losses. For example, an application requiring a 150 Farad capacitor may include a 300 Farad capacitor as a buffer. Oversized capacitors may increase a size and/or cost of the failsafe device. Furthermore, traditional capacitive return failsafe devices provide no indication of the lifetime of the capacitor. For example, after two years of use, the capacitor in a failsafe device may have degraded to the point that it is unable to provide the energy required to drive the failsafe device to a failsafe position. To continue the example, the traditional failsafe device may provide no indication of the degraded capacitor and the user may not know that the failsafe device is unable to return to a failsafe position in a failure event. Actuator 502 includes a capacitor to facilitate return to a failsafe position. Actuator 502 may measure the lifetime of the capacitor and provide an indication of the lifetime to a BMS. For example, actuator 502 may measure the effective capacitance of the capacitor as an indication of the lifetime of the capacitor. Furthermore, actuator 502 may measure an amount of energy required to return the failsafe device to a failsafe position and compare the amount of energy to the effective capacitance to determine whether the capacitor is able to provide enough energy to return the failsafe device to the failsafe position. By comparing the effective capacitance to the amount of energy required to return the failsafe device to the failsafe position, actuator 502 may extend the lifetime of the device. For example, a capacitor may degraded from an initial capacity of 300 Farads to an effective capacity of 150 Farads. However, if the amount of energy required to return the failsafe device to the failsafe position only requires an effective capacitance of 80 Farads then actuator 502 may determine that the capacitor is still functional, thereby prolonging the life of the device. In various embodiments, actuator 502 may alert a BMS that the device needs to be replaced. For example, actuator 502 may determine a charge voltage required to charge a capacitor with enough energy to return the failsafe device to the failsafe position is too high (e.g., would cause breakdown of the capacitor) and may send an indication to a BMS that actuator 502 and/or the capacitor should be replaced. In some embodiments, the determined charge voltage is compared to a threshold voltage to determine an indication of the lifetime of the capacitor. In some embodiments, actuator 502 may determine a speed with which to drive the failsafe device. For example, based on the measured lifetime, actuator 502 may facilitate a user to select between a first speed and a second speed. The first speed may be associated with a first lifetime (e.g., 60 second stroke/2 years) and the second speed may be associated with a second lifetime (e.g., 120 second stroke/5 years). In some embodiments, actuator 502 may slow down the speed with which the failsafe device is driven to prolong the life of the device. Additionally, actuator 502 may adjust the charge voltage for the capacitor to prolong the life of the capacitor. Actuator 502 may determine a charge voltage for the capacitor based on comparing the effective capacitance to the energy required to return the failsafe device to the failsafe position. For example, actuator 502 may require a capacitance of 80 Farads at a first charge voltage to return a failsafe device to a failsafe position, but only have an effective capacitance of 60 Farads. However, actuator 502 may determine, based on a comparison of the amount of energy required and the effective capacitance of the capacitor, that the amount of energy required may be achieved with an effective capacitance of 60 Farads at a higher second charge voltage. Therefore, actuator 502 may charge the capacitor at the second charge voltage. This may prolong the life of the device. Additionally or alternatively, actuator 502 may determine the amount of time needed to charge the capacitor. For example, actuator 502 may determine an effective resistance associated with returning the failsafe device to a failsafe position and an effective capacitance of the capacitor and thereby calculate the time required to charge the capacitor. In some embodiments, actuator 502 may provide diagnostics associated with the operation of actuator 502. For example, actuator 502 may test if the capacitor is able to provide enough energy to drive the failsafe device to the failsafe position. Actuator 502 may provide an indication of the test (e.g., alert a user if the test fails, etc.).

Actuator 502 is shown to include capacitor 504, power supply 506, voltage regulator 514, motor 516, drive device 518, position sensors 520, communications circuit 526, and processing circuit 536. In this exemplary embodiment, FIG. 5 is of actuator 502 for building subsystem 428. However, in other embodiments the implementation of a super capacitor with adjustable charge voltage is used for a different device. In some embodiments, the device may be a device outside of building subsystems 428 or within a different subsystem of building subsystem 428. For example, instead of being an actuator, the device may be a chiller, a boiler, a rooftop air handling unit (AHU), or other client devices.

Actuator 502 is shown to include a processing circuit 536 communicably coupled to motor 516. In some embodiments, motor 516 is a brushless DC ("BLDC") motor. Processing circuit 536 is shown to include a main actuator controller 524, memory 532, and a processor 534. Processor 534 may be a general purpose or specific purpose processor, an application specific integrated circuit ("ASIC"), one or more field programmable gate arrays ("FPGA"), a group of processing components, or other suitable processing components. Processor 534 may be configured to execute computer code or instructions stored in memory 532 or received from other computer readable media (e.g., CDROM, network storage, a remote server, etc.).

Memory 532 may include one or more devices (e.g., memory units, memory devices, storage devices, etc.) for storing data and/or computer code for completing and/or facilitating the various processes described in the present disclosure. Memory 532 may include random access memory ("RAM"), read-only memory ("ROM"), hard drive storage, temporary storage, non-volatile memory, flash memory, optical memory, or any other suitable memory for storing software objects and/or computer instructions. Memory 532 may include database components, object code components, script components, or any other type of information structure for supporting the various activities and information structures described in the present disclosure. Memory 532 may be communicably connected to processor 534 via processing circuit 536 and may include computer code for executing (e.g., by processor 534) one or more processes described herein. When processor 534 executes instructions stored in memory 532, processor 534 generally configures actuator 502 (and more particularly processing circuit 536) to complete such activities.

Main actuator controller 524 may be configured to receive external control data 530 (e.g., position setpoints, speed setpoints, etc.) from communications circuit 526 and position signals 522 from position sensors 520. Main actuator controller 524 may be configured to determine the position of motor 516 and/or drive device 518 based on position signals 522. In some embodiments, main actuator controller 524 receives data from additional sources. For example, main actuator controller 524 may receive information from sensors (e.g., temperature sensors, humidity sensors, etc.) within building subsystems 428, as described in detail with reference to FIG. 4.

Motor 516 may be coupled to drive device 518. Drive device 518 may be a drive mechanism, a hub, or other device configured to drive or effectuate movement of a HVAC system component (e.g., equipment 538). For example, drive device may be configured to receive a shaft of a damper, a valve, or any other movable HVAC system component in order to drive (e.g., rotate) the shaft. In some embodiments, actuator 502 includes a coupling device configured to aid in coupling drive device 518 to the movable HVAC system component. For example, the coupling device may facilitate attaching drive device 518 to a valve or damper shaft.

Position sensors 520 may include Hall effect sensors, potentiometers, optical sensors, or other types of sensors configured to measure the rotational position of the motor 516 and/or drive device 518. Position sensors 520 may provide position signals 522 to processing circuit 536. Main actuator controller 524 may use position signals 522 to determine whether to operate the motor 516. For example, main actuator controller 524 may compare the current position of drive device 518 with a position setpoint received via external data input 530 and may operate the motor 516 to achieve the position setpoint.

Actuator 502 is further shown to include a communications circuit 526. Communications circuit 526 may be a wired or wireless communications link and may use any of a variety of disparate communications protocols (e.g., BACnet, LON, WiFi, Bluetooth, NFC, TCP/IP, etc.). In some embodiments, communications circuit 526 is an integrated circuit, chip, or microcontroller unit ("MCU") configured to bridge communications actuator 502 and external systems or devices. In some embodiments, communications circuit 526 is the Johnson Controls BACnet on a Chip ("JBOC") product. For example, communications circuit 526 may be a pre-certified BACnet communication module capable of communicating on a building automation and controls network (BACnet) using a master/slave token passing ("MSTP") protocol. Communications circuit 526 may be added to any existing product to enable BACnet communication with minimal software and hardware design effort. In other words, communications circuit 526 provides a BACnet interface for actuator 502. Further details regarding the JBOC product are disclosed in U.S. patent application Ser. No. 15/207,431 filed Jul. 11, 2016, the entire disclosure of which is incorporated by reference herein.

Communications circuit 526 may also be configured to support data communications within actuator 502. In some embodiments, communications circuit 526 may receive internal actuator data 528 from main actuator controller 524. For example, internal actuator data 528 may include a measured or calculated motor torque, the actuator position or speed, configuration parameters, end stop locations, stroke length parameters, commissioning data, equipment model data, firmware versions, software versions, time series data, a cumulative number of stop/start commands, a total distance traveled, an amount of time required to open/close equipment 538 (e.g., a valve), or any other type of data used or stored internally within actuator 502. In some embodiments, communications circuit 526 may transmit external data 530 to main actuator controller 524. External data 530 may include, for example, position setpoints, speed setpoints, control signals, configuration parameters, end stop locations, stroke length parameters, commissioning data, equipment model data, actuator firmware, actuator software, or any other type of data which may be used by actuator 502 to operate the motor 516 and/or drive device 518.

In some embodiments, external data 530 is a DC voltage control signal. Actuator 502 may be a linear proportional actuator configured to control the position of drive device 518 according to the value of the DC voltage received. For example, a minimum input voltage (e.g., 0.0 VDC) may correspond to a minimum rotational position of drive device 518 (e.g., 0 degrees, −5 degrees, etc.), whereas a maximum input voltage (e.g., 10.0 VDC) may correspond to a maximum rotational position of drive device 518 (e.g., 90 degrees, 95 degrees, etc.). Input voltages between the minimum and maximum input voltages may cause actuator 502 to move drive device 518 into an intermediate position between the minimum rotational position and the maximum rotational position. In other embodiments, actuator 502 may be a non-linear actuator or may use different input voltage ranges or a different type of input control signal (e.g., AC voltage or current) to control the position and/or rotational speed of drive device 518.

In some embodiments, external data 530 is an AC voltage control signal. Communications circuit 526 may be configured to transmit an AC voltage signal having a standard power line voltage (e.g., 120 VAC or 230 VAC at 50/60 Hz). The frequency of the voltage signal may be modulated (e.g., by main actuator controller 524) to adjust the rotational position and/or speed of drive device 518. In some embodiments, actuator 502 uses the voltage signal to power various components of actuator 502. Actuator 502 may use the AC voltage signal received via communications circuit 526 as a control signal, a source of electric power, or both. In some embodiments, the voltage signal is received from a power supply line that provides actuator 502 with an AC voltage having a constant or substantially constant frequency (e.g., 120 VAC or 230 VAC at 50 Hz or 60 Hz). Communications circuit 526 may include one or more data connections (separate from the power supply line) through which actuator 502 receives control signals from a controller or another actuator (e.g., 0-10 VDC control signals).

In some embodiments, actuator 502 is an actuator in building subsystems 428. Alternatively, actuator 502 may be outside of building subsystems 428 (not shown). Actuator 502 may be configured to be connected to capacitor 504 and powered by capacitor 504. Actuator 502 may consume electricity from an electric utility and may also be powered by power supply 506. The initial position ($P_i$) of actuator 502 and the final position ($P_f$) of actuator 502 may be input to memory 532. The initial position ($P_i$) of actuator 502 may be the position of actuator 502 when processor 534 first receives a signal that power is lost to actuator 502 from power supply 506 (e.g., a first indication of no power). The final position ($P_f$) of actuator 502 may be the position of actuator 502 (e.g., an actuator) when actuator 502 returns to a default position.

In some embodiments, capacitor 504 is configured to provide a processor (e.g., processor 534) with the values of voltages across capacitor 504 at various times. For example, processor 534 may be configured to measure the value of an initial voltage ($V_i$), across capacitor 504 at the time when actuator 502 is in position $P_i$, the value of a final voltage ($V_f$) across capacitor 504 at the time when actuator 502 is in position $P_f$, the value of a first voltage ($V_1$) across capacitor 504 at a first specified time $t_1$, and/or the value of a second voltage ($V_2$) across capacitor 504 at a second specified time $t_2$. In some embodiments, the difference between the first time ($t_1$) and the second time ($t_2$) is a predetermined time. Voltage readings (e.g., $V_i$, $V_f$, $V_1$, $V_2$) may be input to non-volatile memory (e.g., memory 532) to be used in calculations to determine capacitance (C), energy used by actuator 502 to return to its default position ($W_r$), and/or charge voltage ($V_c$). In some embodiments, capacitor 504 is an electrostatic double-layer capacitor ("EDLC") super capacitor that is charged by power supply 506. Power supply 506 may also be configured to power actuator 502. Alternatively, more than one power supply may be configured to power actuator 502 and/or capacitor 504. In some embodiments, capacitor 504 transmits diagnostic information. For example, actuator 502 may test that capacitor 504 has enough energy to return a failsafe device (e.g., drive motor 516) to a failsafe position and report upon the test. In some embodiments, the test may occur periodically (e.g., every time actuator 502 is powered down, etc.). For example, upon power down, capacitor 504 may power motor 516 to drive drive device 518 to a failsafe position and position sensors 520 may determine if capacitor 504 was able to do so. In response, actuator 502 may provide diagnostic information to a user and/or BMS controller 366. In some embodiments, the diagnostic information may indicate that capacitor 504 and/or actuator 502 need to be replaced.

Still referring to FIG. 5, memory 534 may be configured to store various modules that may calculate the charge voltage (10 (i.e., a maximum voltage level that may be used to charge the super capacitor). In this exemplary embodiment, memory 534 is shown to include main actuator controller 524, capacitance module 508, energy module 510, and charge voltage module 512. However, in some embodiments memory 534 includes more modules and/or excludes one or more of the modules shown in FIG. 5. For example, memory 534 may include one module that completes both calculations performed by energy module 510 and capacitance module 508.

In some embodiments, capacitance module 508 is configured to determine a capacitance (C) of a super capacitor (e.g., capacitor 504). In some embodiments, capacitance module 508 receives inputs from memory 534. The inputs may correspond to the voltage measured across the super capacitor at time $t_1$ and the voltage measured across the super capacitor at time $t_2$; voltages $V_1$ and $V_2$ respectively. Using these voltage readings, capacitance module 508 may determine the capacitance of the super capacitor using Equation 1:

$$C = \frac{(V_1 - V_2)}{(t_1 - t_2)} \quad (1)$$

In some embodiments, the difference between $t_1$ and $t_2$ is a predetermined length of time. Advantageously, this may ensure that the time between each voltage measurement is consistent for calculating the capacitance for each power cycle of the power supply. In some embodiments, capacitance module 508 outputs the determined capacitance (C) to energy module 510 and charge voltage module 512 to be used in other calculations.

In some embodiments, energy module 510 is configured to determine the energy value ($W_r$) used for a device (e.g., actuator 502) to return to a default position after losing power. Additionally, the calculation of $W_r$ may be stored in non-volatile memory (e.g., memory 532). After $W_r$ is determined by energy module 510, the value of $W_r$ may be output to charge voltage module 512. In some embodiments, energy module 510 calculates $W_r$ by taking the difference between two values of energy, initial energy $W_i$ and final energy $W_f$. $W_i$, $W_f$, and $W_r$ is determined using Equation 2, Equation 3, and Equation 4, respectively:

$$W_i = \tfrac{1}{2}CV_i^2 \quad (2)$$

$$W_f = \tfrac{1}{2}CV_f^2 \quad (3)$$

$$W_r = W_i - W_f \quad (4)$$

where C is the calculated capacitance from capacitance module 508, $V_i$ is the voltage across the super capacitor when actuator 502 is at an initial position $P_i$, and $V_f$ is the voltage across the super capacitor when actuator 502 is at a final position $P_f$.

In some embodiments, charge voltage module 512 is configured to determine the charge voltage ($V_c$) (i.e., a maximum voltage level that may be used to charge the super capacitor). For example, charge voltage module 512 calculates $V_c$ and outputs voltage data to voltage regulator 514 in order to regulate capacitor 504. In some embodiments, charge voltage module 512 receives inputs from capacitance module 508 and energy module 510 within memory 532 that include values for capacitance (C) and energy value ($W_r$), respectively. Using the previously determined values of C and $W_r$, charge voltage module 512 may calculate the value of charge voltage using Equation 5:

$$V_c = \sqrt{\frac{2W_r}{C}} \quad (5)$$

where $W_r$ is the energy used to return the device to a default position after power is lost and C is the capacitance of the super capacitor. After completion of calculating charge voltage, charge voltage module 512 may be configured to output the determined value of charge voltage as voltage data to voltage regulator 514.

Voltage regulator 514 may be configured to control charge voltage ($V_c$). In some embodiments the voltage regulator may take the form of a potentiometer configured to control $V_c$ by changing the feedback resistance of a power supply for each power cycle of the power supply. However, in other embodiments the voltage regulator may take the form of a digital to analog converter configured to control $V_c$ by changing the feedback resistance attached to a regulator feedback pin for each power cycle of the power supply. In yet other embodiments the voltage regulator may take the form of a silicon controlled rectifier configured to control $V_c$ by changing a feedback resistance of a power supply for each power cycle of the power supply. In still other embodiments the voltage regulator may take the form of an adjustable power supply output configured to control $V_c$ by a variable output adjusted for each power cycle of the power supply. When actuator 502 is first powered on, processor 534 may initialize $V_c$ to a rated voltage for capacitor 504. In some embodiments, the calculated $V_c$ is input as voltage data to voltage regulator 514 from charge voltage module 512 for every cycle of the power supply.

Now referring to FIG. 6, a flowchart of a process for controlling charge voltage of a super capacitor is shown, according to some embodiments. Process 600 may be configured to repeat for each power cycle of a power supply for the device. By continually controlling the charge voltage of a super capacitor to equal that of a minimum required operating voltage, process 600 allows the super capacitor to charge at lower voltages near the beginning of the life cycle of the super capacitor, reducing the aging effect of the capacitor. The super capacitor may then charge to higher voltages later in the life cycle of the super capacitor to offset capacitance reduction because of the aging effect. In some embodiments, process 600 is performed by various components of memory 532. In other embodiments, process 600 is completed by components outside of memory 532, such as by a controller outside of actuator 502.

Process 600 is shown to include measuring a first voltage across a super capacitor (step 602). The first voltage ($V_1$) may be measured across the super capacitor (e.g., capacitor 504) by processor 534 within processing circuit 536 at a time $t_1$. Time $t_1$ may be a predetermined value that occurs a certain amount of time before a second time $t_2$. For example, time $t_1$ may occur one minute before time $t_2$. Measurement $V_1$ may be input back into memory (e.g., memory 532) to be used in calculating capacitance (C) in capacitance module 508.

Process 600 is shown to include measuring a second voltage across the super capacitor (step 604). The second voltage ($V_2$) may be measured across the super capacitor (e.g., capacitor 504) by processor 534 at a second specific time $t_2$. Time $t_2$ may be predetermined by processor 534 to be a specific amount of time after the first time $t_1$. Voltage measurement $V_2$ may be input into non-volatile memory (e.g., memory 532) in order to calculate capacitance (C) in capacitance module 508. In some embodiments, steps 602-604 include discharging the capacitor through a know load. Additionally or alternatively, steps 602-604 may include determining an output current of the capacitor based on the discharge through a known load. In various embodiments, the output current of the capacitor may be used to determine the effective capacitance of the capacitor.

Process 600 is shown to include calculating a capacitance using the first and second voltages (step 606). In some embodiments, step 606 is accomplished by an equation stored within capacitance module 508 in memory. Once the values of the first and second voltages are measured and stored in memory, capacitance module 508 may determine the capacitance (C) with an equation saved in memory as well. The equation applied for capacitance may be the same as Equation 1, described more in detail with reference to FIG. 5.

Process 600 is shown to include calculating a charge voltage using the calculated capacitance (step 608). The calculated capacitance may be the capacitance determined in step 606. In some embodiments, charge voltage module 512 completes step 608 using an equation stored within memory (e.g., memory 532) to determine the charge voltage. The charge voltage ($V_c$) is calculated to be a minimum required operating voltage that ensures proper operation of the fail safe return. The fail safe return for an actuator, for example, is that the actuator returns to a default position when a loss of power is endured. Applying the minimum required operating voltage to the super capacitor reduces the aging effect of the capacitor and extends the life cycle of the super capacitor. The equation applied to determine charge voltage may be Equation 5, described with reference to FIG. 5, where $W_r$ is the calculated energy value used by the actuator to return to the default position and C is the calculated capacitance. In some embodiments, step 608 includes comparing the calculated capacitance to an amount of energy required for the fail safe return. For example, process 600 may include measuring the amount of energy required to drive an actuator from a first position to a failsafe position and comparing the measured amount of energy to an effective capacitance of the capacitor to determine a charge voltage for the capacitor. In some embodiments, process 600 may include sending an indication of the lifetime of the capacitor to a BMS. For example, process 600 may include determining a charge voltage for the capacitor as described in the example above, comparing the charge voltage to a breakdown voltage of the capacitor, and sending an indication to the BMS of the lifetime of the device based on the comparison. In some embodiments, the indication of the lifetime of the capacitor may indicate that the capacitor needs to be replaced.

Process 600 is shown to include applying the charge voltage (K) to the super capacitor (step 610). After step 608 has completed and the charge voltage has been determined, step 610 may be completed by charge voltage module 512 in memory and a voltage regulator (e.g., voltage regulator 514 described with reference to FIG. 5). In some embodiments, processor 534 passes on the value of the charge voltage as voltage data from memory to voltage regulator 514 via communications circuit 526, described in detail with reference to FIG. 5. Processor 534 then sets a final charging voltage of the capacitor for the power cycle of power supply 506 to the calculated $V_c$. The final charging voltage of the super capacitor may be controlled by regulation of power supply 506 for the capacitor via voltage regulator 514.

Referring now to FIG. 7, a flowchart of a process 700 for determining an energy value corresponding to an actuator operation is shown, according to some embodiments. Process 700 may be configured to repeat for each power cycle of power supply 506 to actuator 502. In order to ensure that actuator 502 returns to a default position when power is lost, an amount of energy consumed for actuator 502 to return to the default position is calculated. The calculated value of energy consumed is then used to determine a minimum required operating voltage. In some embodiments, process 700 is used to calculate the energy value used in step 608 of process 600, described in detail with reference to FIG. 6. Process 700 may be performed by various components within memory 532. In some embodiments, one or more steps of process 700 is performed by components outside of memory 532.

Process 700 is shown to include checking if an actuator has power or does not have power (step 702). If processor 534 determines in step 702 that the actuator is powered, process 700 is shown to proceed with measuring an initial voltage across the super capacitor (step 704). The initial voltage ($V_i$) may be measured by the processor (e.g., processor 534) within the BMS controller to correspond with the voltage across the super capacitor when actuator 502 is at an initial position $P_i$. For example, the initial position $P_i$ is a position of actuator 502 when processor 534 first receives a signal that actuator 502 has lost power. However, if during step 702 processor 534 determines that actuator 502 is not powered, process 700 is shown to proceed with repeating to check if actuator 502 is powered (step 702).

Process 700 is shown to include calculating an initial energy value (step 706). In some embodiments, step 706 is completed by energy module 510 within memory (e.g., memory 532). In some embodiments, energy module 510 receives inputs from capacitance module 508 of the calculated capacitance (C) and the initial voltage ($V_i$) measured across the super capacitor (e.g., capacitor 504) in step 704. The initial energy value may be determined by an equation stored in energy module 510. For example, the equation applied to calculate the initial energy value may be the same as Equation 2, described in detail with reference to FIG. 5.

Process 700 is shown to include checking if the actuator is in default position (step 708). If processor 534 determines in step 708 that actuator 502 is not in default position, process 700 is shown to proceed with continuing to check if actuator 502 is in default position (step 708). However, if processor 534 determines in step 708 that actuator 502 is in default position, process 700 is shown to proceed with measuring a final voltage across the super capacitor (step 710). In some embodiments, final voltage ($V_f$) is measured by processor 534 to be a value of the voltage across the super capacitor (e.g., capacitor 504) when actuator 502 is at a final position ($P_f$). For example, the final position is the position of actuator 502 when actuator 502 has returned to the default position. In various embodiments, the default position is within the range of the actuator 502 (e.g., actuator 502 is in between fully extended and fully retracted, in the middle, etc.).

Process 700 is shown to include calculating a final energy value (step 712). In some embodiments, step 712 is completed by energy module 510 within memory (e.g., memory 532). In some embodiments, energy module 510 receives input from capacitance module 508 of the capacitance (C) calculated in step 606 of process 600 and input from memory 532 of the value of the final voltage ($V_f$) measured across the super capacitor (e.g., capacitor 504) in step 710. The final energy value ($W_f$) may be determined by an equation stored in energy module 510. For example, the equation applied to determine the final energy value may be the same as Equation 3, described in detail with reference to FIG. 5.

Process 700 is shown to include calculating an energy value using initial and final energy values (step 714). In some embodiments, step 714 is also be completed by energy module 510 within memory. Using both calculated values of the initial energy value ($W_i$) and the final energy ($W_f$) value from steps 706 and 712 respectively, energy module 510 may determine the energy value ($W_r$) by applying an equation stored in non-volatile memory (e.g., memory 532). For example, the equation applied to determine the energy value that uses both the initial and final energy values may be the same as Equation 4, described in detail with reference to FIG. 5. In some embodiments, the difference between the initial energy value and final energy value calculates the amount of energy consumed for the actuator (e.g., actuator 502) to return to its default position. In other embodiments, energy value $W_r$ is determined by taking the absolute value of the initial energy value subtracted from the final energy value.

Referring now to FIG. 8, a flowchart of a process 800 for determining parameters associated with a failsafe device is shown, according to some embodiments. Process 800 may be configured to repeat for each power cycle of power supply 506 to actuator 502. Additionally or alternatively, process 800 may repeat at scheduled intervals (e.g., every month, etc.). In some embodiments, the results of process 800 are stored in memory for later use (e.g., for calculating lifetime trends of actuator 502, etc.). In various embodiments, process 800 is used to calculate the values used in process 900 and 1000, as described in detail below. Process 800 may be performed by various components within memory 532. In some embodiments, one or more steps of process 800 are performed by components outside of memory 532.

Process 800 is shown to include measuring an amount of energy required to return a failsafe device to a failsafe position (step 810). In some embodiments, actuator 502 is the failsafe device. Additionally or alternatively, the failsafe device may be any device configured to return to a failsafe position upon failure (e.g., removal of power, etc.). The failsafe position may be a specific position within the range of movement of the failsafe device. For example, a linear actuator may fail to a midway point between fully extended and fully retracted. In some embodiments, the failsafe position is determined dynamically (e.g., in response to a failure type, etc.). In some embodiments, step 810 is performed according to methods disclosed above in reference to FIG. 5. Additionally or alternatively, step 810 may be performed according to steps 812-816.

At step 812, actuator 502 positions the failsafe device in a first position. For example, motor 516 may drive drive device 518 to a positional extreme (e.g., fully extended, fully retracted, etc.). At step 814, actuator 502 measures the current (I) and voltage (V) associated with driving the failsafe device to the failsafe position. For example, motor 516 may drive drive device 518 to a specific position (e.g., midway between fully extended and fully retracted, etc.) and measure the associated voltage and current. In some embodiments, energy module 510 calculates (step 816) the amount of energy required to return the failsafe device to the failsafe position using Equation 6 and Equation 7:

$$W = V * I \qquad (6)$$

$$J = W * s \qquad (7)$$

where s is the time associated with driving the failsafe device to the failsafe position, and J is the amount of energy required. In various embodiments, the amount of energy required (J) is stored in memory for later use.

At step 820, actuator 502 measures an effective capacitance of the capacitor (e.g., capacitor 504). In some embodiments, step 820 is performed according to methods disclosed above in reference to FIG. 5. Additionally or alternatively, step 820 may be performed according to steps 822-832. At step 822, the capacitor (e.g., capacitor 504) is charged to full. In some embodiments, the capacitor may be charged to a different level (e.g., half-charged, etc.). At step 824, capacitance module 508 may measure a first voltage of the capacitor. At step 826, the capacitor is discharged through a known load (e.g., a fixed resistance, etc.). At step 828, capacitance module 508 may measure a current associated with the discharge. At step 830, capacitance module 508 may measure a second voltage of the capacitor. At step 832, capacitance module 832 determines, based on the previously measured values, the effective capacitance of the capacitor. In some embodiments, capacitance module 508 calculates the effective capacitance of the capacitor via the time constant ($\tau$) using Equations 8 and/or Equation 9:

$$V_c = V_0 * e^{t/RC} \qquad (8)$$

$$\tau = RC \qquad (9)$$

where $V_c$ is the voltage across the capacitor after time t, $V_0$ is the initial voltage across the capacitor, R is the known resistance, and $\tau$ is the time constant of the circuit corresponding to the time required to charge the capacitor from an initial voltage of zero to approximately 63.2% of the value of an applied DC source (alternatively, the time constant may correspond to the time required to discharge the capacitor from full charge to 36.8% of full charge).

Figure 9:
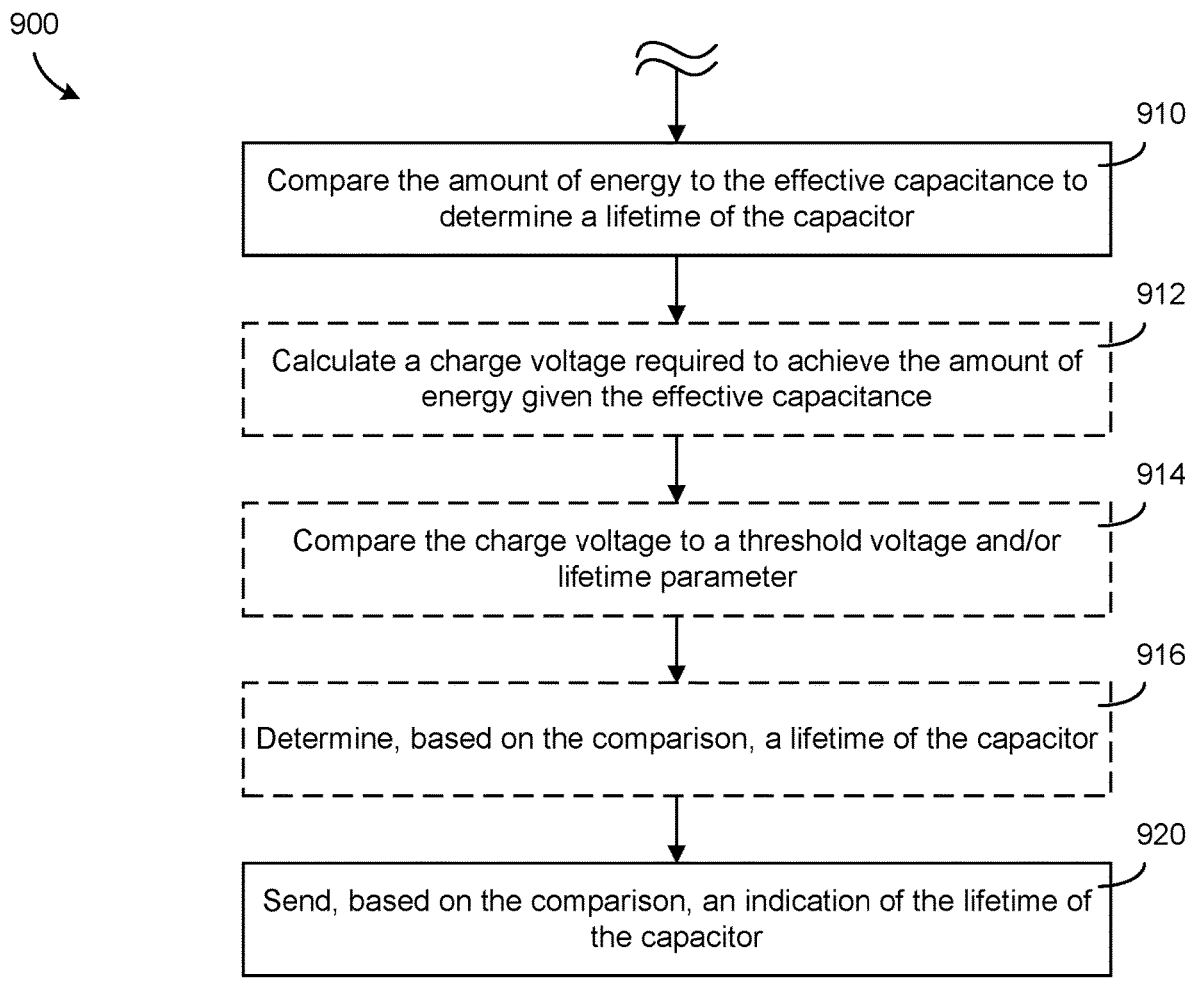
FIG. 9 is a flowchart of a process for determining a lifetime of a capacitor, according to some embodiments.

Referring now to FIG. 9, a flowchart of a process 900 for determining a lifetime of a capacitor is shown, according to some embodiments. Process 900 may be configured to repeat for each power cycle of power supply 506 to actuator 502. Additionally or alternatively, process 900 may repeat at scheduled intervals (e.g., every week, etc.). In some embodiments, the results of process 900 are stored in memory (e.g., for calculating lifetime trends of actuator 502, etc.). In various embodiments, process 900 uses the values from process 800. Process 900 may be performed by various components within memory 532. In some embodiments, one or more steps of process 900 are performed by components outside of memory 532. In various embodiments, process 900 may determine a remaining operational period for capacitor 504 and send an indication of the operational period. The operational period corresponds to the length of time capacitor 504 is capable of storing the amount of energy required to return a failsafe device to a failsafe position. This may allow building operators to replace defective failsafe devices/capacitors before they become non-functional. Furthermore, it may reduce and/or eliminate a need to manually test failsafe devices for operability and therefore increase system reliability and uptime and reduce maintenance overhead.

Process 900 is shown to include comparing the amount of energy required to return the failsafe device to the failsafe position to the effective capacitance of the capacitor to determine a lifetime of the capacitor (step 910). In some embodiments, step 910 is performed as described above. Additionally or alternatively, step 910 may include performing any of steps 912-916. At step 912, a charge voltage required to achieve the amount of energy required to return the failsafe device to the failsafe position is calculated given the effective capacitance of the capacitor (e.g., capacitor 504). In some embodiments, charge voltage module 512 performs step 912 using Equation 2 above. At step 914, the charge voltage is compared to a threshold voltage and/or a lifetime parameter of the capacitor. For example, the charge voltage determined in step 912 may be compared to a breakdown voltage of the capacitor. At step 916, based on the comparison, a lifetime of the capacitor is determined. In some embodiments, step 916 includes analyzing saved device data. For example, charge voltage module 512 may analyze previously determined charge voltages over time and determine from the slope of the relationship a predicted date that the charge voltage required for the capacitor exceeds operable levels (e.g., a breakdown voltage, etc.).

Process 900 is shown to include sending, based on the determination of the lifetime of the capacitor, an indication of the lifetime of the capacitor (step 920). In some embodiments, the indication is sent to BMS controller 366. Additionally or alternatively, the indication may be sent to a building operator. The indication may display remaining service life of actuator 502. In some embodiments, the indication may allow a user to change the operation of actuator 502. For example, a user may elect to slow down a drive speed of the failsafe device to prolong the life of the device. In some embodiments, the indication includes diagnostics associated with actuator 502. For example, the indication may include a plot of the effective capacitance of the device over time.

Figure 9A:
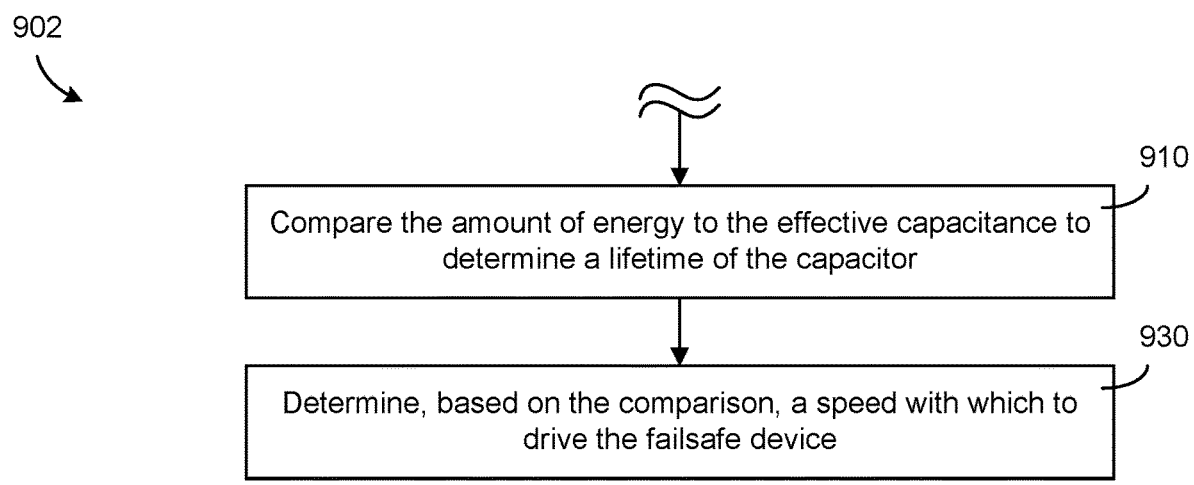
FIG. 9A is a flowchart of a process for determining a speed with which to drive a failsafe device, according to some embodiments.

Referring now to FIG. 9A, process 902 is shown for determining a speed with which to drive a failsafe device. Similar to process 900, process 902 includes step 910. Step 910 may include steps 912-916, as described in detail above with reference to FIG. 9. Process 902 is shown to include determining, based on determining a lifetime of the capacitor, a speed with which to drive the failsafe device (step 930). In some embodiments, step 930 includes prompting the user for input. For example, actuator 502 may allow a user to select a failsafe drive speed/load tradeoff such as "if full stroke speed set to 120 seconds during failsafe mode, actuator will drive 'x' N-m load for at least 5 years; if full stroke speed set to 60 second during failsafe mode, actuator will drive 'x' N-m load for at least 3 years." Additionally or alternatively, the drive speed may be determined automatically. For example, actuator 502 may reduce the speed of the actuator to half the nominal speed in response to determining that the failsafe device has 10% of its lifetime remaining. Reducing the speed of the actuator may extend the lifetime of the device.

Figure 10:
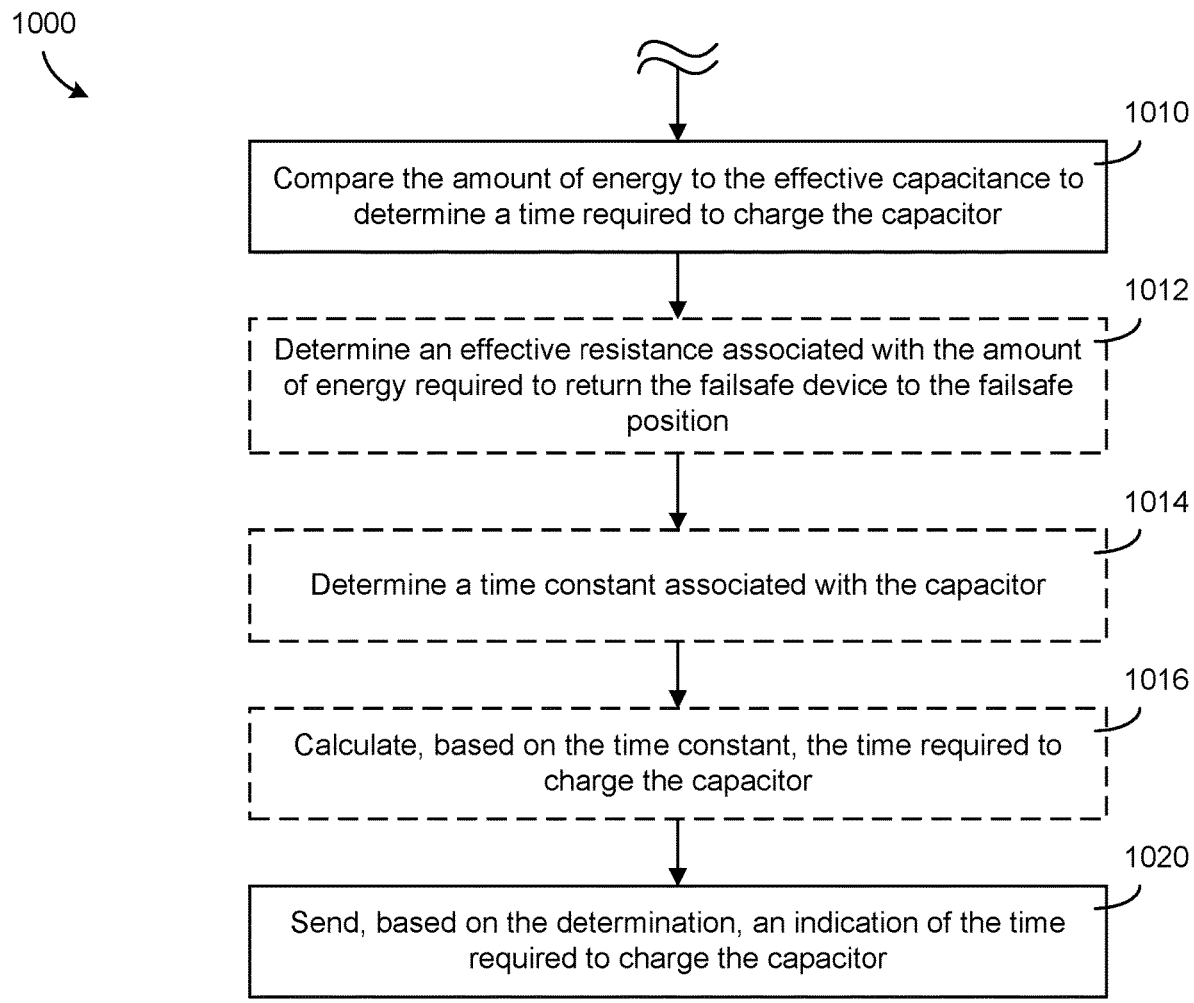
FIG. 10 is a flowchart of a process for determining a time required to charge a capacitor, according to some embodiments.

Referring now to FIG. 10, a flowchart of a process 1000 for determining a time required to charge a capacitor (e.g., capacitor 504) is shown, according to some embodiments. Process 1000 may be configured to repeat for each power cycle of power supply 506 to actuator 502. Additionally or alternatively, process 1000 may repeat at scheduled intervals (e.g., every day, etc.). In some embodiments, the results of process 1000 are stored in memory for later use. In various embodiments, process 1000 uses the measured values from process 800. Process 1000 may be performed by various components within memory 532. In some embodiments, one or more steps of process 1000 are performed by components outside of memory 532.

Process 1000 is shown to include comparing the amount of energy to the effective capacitance to determine a time required to charge the capacitor (step 1010). In some embodiments, charge voltage module 512 uses Equation 9 to calculate an amount of time required to charge the capacitor (e.g., by multiplying the time constant by 5). In some embodiments, step 1010 includes steps 1012-1016. At step 1012, an effective resistance associated with the amount of energy required to return the failsafe device to the failsafe position is determined. In some embodiments, step 1012 is determined using the values from step 810. At step 1014, a time constant associated with the capacitor is determined (e.g., using Equation 9, etc.). At step 1016, based on the time constant, a time required to charge the capacitor is calculated (e.g., by multiplying the time constant r by 5).

Process 1000 is shown to include sending, based on the determined time required to charge the capacitor, an indication of the time required to charge the capacitor (step 1020). In some embodiments, the indication is sent to BMS controller 366. Additionally or alternatively, the indication may be sent to a building operator. In some embodiments, the indication may indicate that capacitor 504 and/or the failsafe device (e.g., actuator 502) need to be replaced. In some embodiments, a different lifetime parameter may be sent. Lifetime parameters may include an estimated lifetime of the capacitor (e.g., as discussed in reference to FIG. 9), a time required to charge the capacitor, and/or diagnostic results associated with the capacitor (e.g., testing the capability of capacitor 504 to supply the power required to return the failsafe device to the failsafe position as discussed above in reference to FIG. 5).

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media may be any available media that may be accessed by a general purpose or special purpose computer or other machine with a processor. By way of example, such machine-readable media may comprise RAM, ROM, EPROM, EEPROM, CD-ROM or other optical disk storage, magnetic disk storage or other magnetic storage devices, or any other medium which may be used to carry or store desired program code in the form of machine-executable instructions or data structures and which may be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method of determining a lifetime parameter of a capacitor in a failsafe device, the method comprising:
    positioning an actuator of the failsafe device in an initial predetermined physical position as detected by the failsafe device;
    measuring an initial voltage across the capacitor at the initial predetermined physical position;
    positioning the actuator in a failsafe predetermined physical position as detected by the failsafe device;
    measuring a final voltage across the capacitor at the failsafe predetermined physical position;
    determining an amount of energy required to return the actuator of the failsafe device from the initial predetermined physical position to the failsafe predetermined physical position based on the initial voltage and the final voltage;
    measuring an effective capacitance of the capacitor; and
    comparing the amount of energy to the effective capacitance to determine the lifetime parameter of the capacitor.

2. The method of claim 1, further comprising:
    determining, based on the effective capacitance, a charge voltage for the capacitor; and
    charging the capacitor using the charge voltage.

3. The method of claim 1, wherein the lifetime parameter is a length of time associated with a remaining operational period of the capacitor.

4. The method of claim 1, wherein the lifetime parameter is an amount of time required to charge the capacitor to a level associated with the amount of energy required to return the failsafe device to the failsafe physical position.

5. The method of claim 1, wherein the lifetime parameter is diagnostic information associated with physically testing an ability of the capacitor to return the failsafe device to the failsafe physical position.

6. The method of claim 1, the method further comprising sending the lifetime parameter to a building management system (BMS), wherein the lifetime parameter indicates that the capacitor should be replaced.

7. The method of claim 1, further comprising charging the capacitor with the amount of energy when the effective capacitance is greater than or equal to the amount of energy.

8. A method of charging a capacitor in an actuator, the method comprising:
    positioning an actuator of a failsafe device in an initial predetermined physical position as detected by the failsafe device;
    measuring an initial voltage across the capacitor at the initial predetermined physical position of the actuator;
    positioning the actuator in a failsafe predetermined physical position as detected by the failsafe device;
    measuring a final voltage across the capacitor at the failsafe predetermined physical position of the actuator;
    determining an amount of energy required to return the actuator from the initial predetermined physical position to the failsafe predetermined physical position based on the initial voltage and the final voltage;
    measuring an effective capacitance of the capacitor;
    determining, based on the effective capacitance and the amount of energy, a charge voltage for the capacitor; and
    charging the capacitor using the charge voltage.

9. The method of claim 8, further comprising:
    comparing the amount of energy to the effective capacitance to determine a lifetime parameter of the capacitor; and
    sending the lifetime parameter.

10. The method of claim 9, wherein the lifetime parameter indicates that the capacitor should be replaced.

11. The method of claim 9, wherein the lifetime parameter is a length of time associated with a remaining operational period of the capacitor.

12. The method of claim 9, wherein the lifetime parameter is an amount of time required to charge the capacitor to a level associated with the amount of energy required to return the actuator to the failsafe physical position.

13. The method of claim 9, wherein the lifetime parameter is diagnostic information associated with physically testing an ability of the capacitor to return the actuator to the failsafe physical position.

14. The method of claim 8, further comprising the steps of charging the capacitor using the charge voltage when the amount of energy is less than or equal to the effective capacitance.

15. A failsafe device assembly, comprising:
    an actuator;
    a capacitor; and
    a processing circuit comprising a processor and memory, the memory having instructions stored thereon that, when executed by the processor, cause the processing circuit to:
        measure an initial voltage across the capacitor in an initial physical position of the actuator;
        measure a final voltage across the capacitor in a final physical position of the actuator;
        determine an amount of energy required to return the actuator to a failsafe physical position based on the initial voltage and the final voltage;
        measure an effective capacitance of the capacitor;
        compare the amount of energy to the effective capacitance to determine an operational parameter of the actuator; and operate the actuator according to the operational parameter.

16. The failsafe device assembly of claim 15, the memory having further instructions stored thereon that, when executed by the processor, cause the processing circuit to:
   determine, based on the effective capacitance, a charge voltage for the capacitor; and
   charge the capacitor using the charge voltage.

17. The failsafe device assembly of claim 15, wherein the operational parameter describes a speed with which the actuator returns to the failsafe physical position.

18. The failsafe device assembly of claim 17, wherein determining the operational parameter of the actuator further includes receiving a selection of the speed from a user.

19. The failsafe device assembly of claim 15, the memory having further instructions stored thereon that, when executed by the processor, cause the processing circuit to:
   compare the amount of energy to the effective capacitance to determine a lifetime parameter of the capacitor; and
   send the lifetime parameter.

20. The failsafe device assembly of claim 19, wherein the lifetime parameter indicates that the capacitor should be replaced.

* * * * *